(12) United States Patent
Kerr et al.

(10) Patent No.: US 7,989,889 B1
(45) Date of Patent: Aug. 2, 2011

(54) INTEGRATED LATERAL HIGH-VOLTAGE METAL OXIDE SEMICONDUCTOR FIELD EFFECT TRANSISTOR

(75) Inventors: Daniel Charles Kerr, Oak Ridge, NC (US); David C. Dening, Stokesdale, NC (US); Julio Costa, Summerfield, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 444 days.

(21) Appl. No.: 12/140,491

(22) Filed: Jun. 17, 2008

(51) Int. Cl.
   *H01L 29/66* (2006.01)
(52) U.S. Cl. .............. 257/339; 257/E29.012; 257/335
(58) Field of Classification Search .............. 257/335, 257/339, E29.012
   See application file for complete search history.

(56) References Cited

U.S. PATENT DOCUMENTS

| | | | |
|---|---|---|---|
| 6,458,632 B1 | 10/2002 | Song et al. | |
| 6,533,907 B2 | 3/2003 | Demaray et al. | |
| 6,660,616 B2 | 12/2003 | Babcock et al. | |
| 7,075,122 B1 | 7/2006 | Yang et al. | |
| 7,135,766 B1 | 11/2006 | Costa et al. | |
| 7,276,766 B2 * | 10/2007 | Tu et al. | 257/343 |
| 7,633,095 B1 | 12/2009 | Kerr et al. | |
| 2003/0089930 A1 | 5/2003 | Zhao | |
| 2005/0118768 A1 * | 6/2005 | Chen | 438/301 |
| 2006/0205106 A1 * | 9/2006 | Fukuda et al. | 438/52 |
| 2007/0007545 A1 | 1/2007 | Salcedo et al. | |
| 2008/0079122 A1 * | 4/2008 | Zhu et al. | 257/635 |
| 2008/0237704 A1 | 10/2008 | Williams et al. | |
| 2009/0090979 A1 * | 4/2009 | Zhu et al. | 257/408 |
| 2009/0162979 A1 | 6/2009 | Yang et al. | |

OTHER PUBLICATIONS

Exhibit A: S. M. Sze, Physics of Semiconductor Devices, John Wiley and SOns, Second Edition, 1981, pp. 32-33,101-105,489-490, and 852.*
Costa, J. et al., "Imtegrated MEMS Switch Technology on SOI-CMOS," Proceedings of Hilton Head Workshop 2008: A Solid-State Sensors, Actuators and Microsystems Workshop.
Costa, J. et al., "A Silicon RFCMOS SOI Technology for Integrated Cellular/WLAN RF TX Modules," Proceedings of the IEEE MTS Microwave Symposium, 2007, pp. 445-448, IEEE.
Guan, Lingpeng et al., "A Fully Integrated SOI RF MEMS Technology for System-on-a-Chip Applications," IEEE Transactions on Electron Devices, Jan. 2006, pp. 167-172, vol. 53, No. 1, IEEE.
Joseph, Alvin et al., "A 0.35 um SiGe BiCMOS Technology for Power Amplifier Applications," IEEE BCTM Conference Proceedings, 2007, pp. 198-201, IEEE.

(Continued)

*Primary Examiner* — Jerome Jackson, Jr.
*Assistant Examiner* — Paul A Budd
(74) *Attorney, Agent, or Firm* — Withrow & Terranova, P.L.L.C.

(57) ABSTRACT

The present invention relates to integration of a lateral high-voltage metal oxide semiconductor field effect transistor (LHV-MOSFET) with other circuitry on a semiconductor wafer, which may be fabricated using low-voltage foundry technology, such as a low-voltage complementary metal oxide semiconductor (LV-CMOS) process. The other circuitry may include low-voltage devices, such as switching transistors used in logic circuits, computer circuitry, and the like, or other high-voltage devices, such as a microelectromechanical system (MEMS) switch. The source to drain voltage capability of the LHV-MOSFET may be increased by using an intrinsic material between the source and the drain. The gate voltage capability of the LHV-MOSFET may be increased by using an insulator material, such as a thick oxide, between the gate and the channel of the LHV-MOSFET.

19 Claims, 27 Drawing Sheets

OTHER PUBLICATIONS

Kelly, Dylan et al., "The State-of-the-Art of Silicon-on-Sapphire CMOS RF Switches," Proceedings of the IEEE Compound Semiconductor Symposium, 2005, pp. 200-205.

Mazure, Carlos et al., "Engineering Wafers for the Nanotechnology Era," Proceedings of ESSCIRC, 2005, pp. 29-38, IEEE.

Shokrani, Mohsen et al., "InGap-Plus(TM): A Low Cost Manufacturable GaAs BiFET Process Technology," Proceedings of the GaAs MANTECH Conference, 2006, pp. 153-156.

Tinella, C. et al., "0.13um CMOS SOI SP6T Antenna Switch for Multi-Standard Handsets," Topic Meeting on Silicon Monolithic Circuits in RF Systems, 2006, pp. 58-61, IEEE.

Tombak, Ali et al., "A Flip-Chip Silicon IPMOS Power Amplifier and a DC/DC Converter for GSM 850/900/1800/1900 MHz Systems," Proceedings of the IEEE Radio Frequency Integrated Circuits Symposium, 2007, pp. 79-82, IEEE.

Wohlmuth, Walter A. et al., "E-/D-pHEMT Technology for Wireless Components," Proceedings of the Compound Semiconductor Circuit Symposium, 2004, pp. 115-118, IEEE.

Mori, Kazuhisa et al., "A 5 to 130V Level Shifter composed of Thin Gate Oxide Dual Terminal Drain PMOSFETS," IEEE Intl. Symp. Power Semiconductor Devices and ICs, 1997, pp. 345-348, IEEE.

Valeri, Stephen J. et al., "A Composite High-Voltage Device Using Low-Voltage SOI MOSFETS," IEEE SOS/SOI Technology Conf., 1990, p. 169-170, IEEE.

Notice of Allowance mailed Aug. 19, 2010 regarding U.S. Appl. No. 12/140,504.

Nonfinal Office Action mailed Mar. 4, 2010 regarding U.S. Appl. No. 12/140,504.

Requirement for Restriction/Election mailed Dec. 18, 2009 regarding U.S. Appl. No. 12/140,504.

Notice of Allowance mailed Aug. 7, 2009 regarding U.S. Appl. No. 12/140,517.

Requirement for Restriction/Election mailed Jun. 16, 2009 regarding U.S. Appl. No. 12/140,517.

* cited by examiner

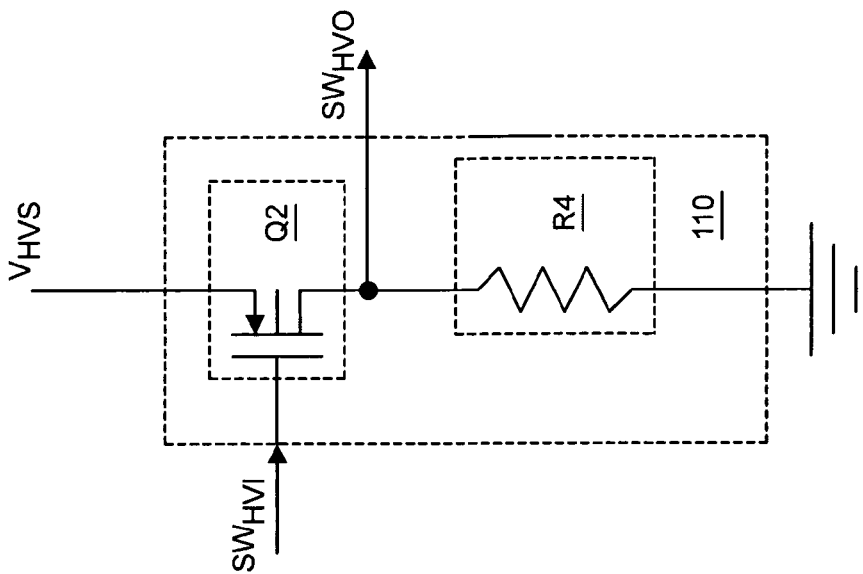
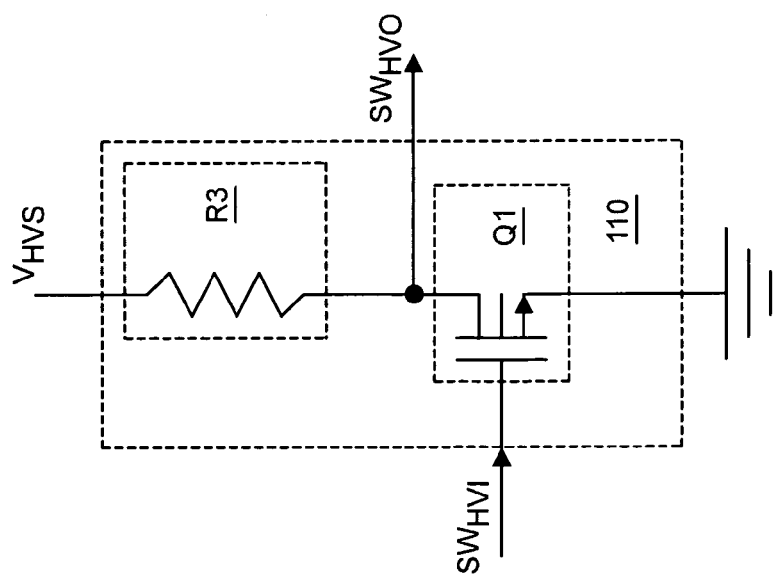
FIG. 20B
FIG. 20A

INTEGRATED LATERAL HIGH-VOLTAGE METAL OXIDE SEMICONDUCTOR FIELD EFFECT TRANSISTOR

This application is related to U.S. patent application Ser. No. 12/140,504 filed Jun. 17, 2008, now U.S. Pat. No. 7,859,009, and U.S. patent application Ser. No. 12/140,517 filed Jun. 17, 2008, now U.S. Pat. No. 7,633,095, which are concurrently filed herewith and are incorporated herein by reference in their entireties.

FIELD OF THE INVENTION

The present invention relates to integration of high-voltage devices, such as high-voltage field effect transistors, high-voltage diodes, and high-voltage thyristors, with other circuitry on semiconductor wafers.

BACKGROUND OF THE INVENTION

As semiconductor wafer fabrication evolves, device geometries become smaller, which provides greater densities that drive down costs, decrease device sizes, increase functionalities, enable increasing levels of integration, or any combination thereof. Increases in densities tend to drive down operating voltages, and semiconductor fabrication processes have evolved toward lower operating voltage processes; however, certain applications require relatively high operating voltages. For example, in a wireless communications device, such as a cell phone, high density computing integrated circuits (ICs) are needed to provide desired functions, such as graphic displays, digital camera functionality, audio player functionality, or the like. However, in the radio frequency (RF) section, antenna switching between a transmitter and a receiver may use a microelectromechanical system (MEMS) switch, which may require an activation voltage greater than 60 volts. Certain graphic displays may require a voltage greater than 20 volts.

To reduce size, cost, and power consumption, it is desirable to integrate low-voltage circuitry, such as computing circuitry, clocks, dividers, memory, decoders, logic, and any other digital circuitry, with high-voltage circuitry, such as a MEMS switch, associated MEMS interface circuitry, and a low-to-high voltage converter, such as a charge pump, on a single semiconductor die, which is provided from a wafer that is fabricated using low-voltage foundry technology. Thus, there is a need to develop high-voltage devices that can be fabricated using low-voltage foundry technology. Specifically, there is a need to develop high-voltage interface and power supply circuitry using the high-voltage devices, and to integrate low-voltage circuitry and the high-voltage interface circuitry on a single semiconductor wafer that is fabricated using the low-voltage foundry technology. Additionally, there is a need to further integrate a high-voltage device, such as a MEMS switch, on the single semiconductor wafer.

SUMMARY OF THE INVENTION

The present invention relates to integration of a lateral high-voltage metal oxide semiconductor field effect transistor (LHV-MOSFET) with other circuitry on a semiconductor wafer, which may be fabricated using low-voltage foundry technology, such as a low-voltage complementary metal oxide semiconductor (LV-CMOS) process. The other circuitry may include low-voltage devices, such as switching transistors used in logic circuits, computer circuitry, and the like, or other high-voltage devices, such as a microelectromechanical system (MEMS) switch. The source to drain voltage capability of the LHV-MOSFET may be increased by using an intrinsic material between the source and the drain. The gate voltage capability of the LHV-MOSFET may be increased by using an insulator material, such as a thick oxide, between the gate and the channel of the LHV-MOSFET.

The LHV-MOSFET may be subjected to high voltages, which may damage the low-voltage devices; therefore, the LHV-MOSFET may be vertically isolated from the low-voltage devices by an insulator layer, which may include Silicon Dioxide or the like. The LHV-MOSFET may be laterally isolated from the low-voltage devices using deep trench isolation. In one embodiment of the present invention, a Silicon-on-Insulator (SOI) wafer is used to provide the LHV-MOSFET and the low-voltage devices. The SOI wafer has an SOI insulator layer, which may be used to provide vertical isolation, and an SOI device layer, which may be used to form the LHV-MOSFET. In an alternate embodiment of the present invention, a traditional semiconductor wafer having a substrate may be used to provide the LHV-MOSFET and the low-voltage devices. An insulator layer is formed over the substrate to provide the vertical isolation.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIGS. 20A and 20B show details of the high-voltage switch using different single-ended configurations of MOSFETs.

DETAILED DESCRIPTION OF THE PREFERRED EMBODIMENTS

Figure 1:
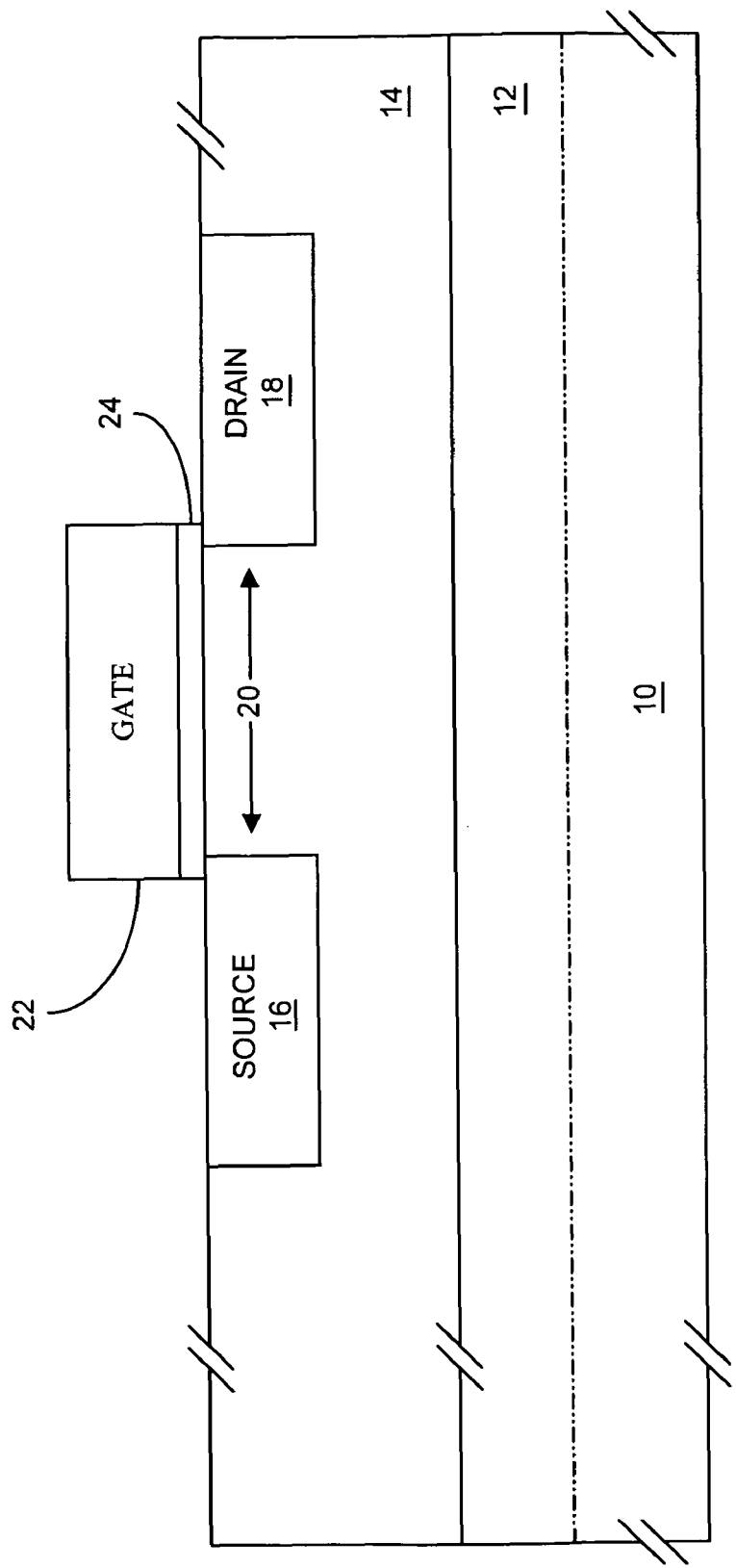
FIG. 1 shows a traditional semiconductor wafer providing a lateral metal oxide semiconductor field effect transistor (MOSFET) using a low-voltage foundry technology, according to the prior art.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to integration of lateral high-voltage devices, such as a lateral high-voltage metal oxide semiconductor field effect transistor (LHV-MOSFET), a lateral high-voltage diode (LHVD), a lateral high-voltage thyristor, or any combination thereof, with other circuitry on a semiconductor wafer, which may be fabricated using low-voltage foundry technology, such as a low-voltage complementary metal oxide semiconductor (LV-CMOS) process. The other circuitry may include low-voltage devices, such as switching transistors used in logic circuits, computer circuitry, and the like, or other high-voltage devices, such as a microelectromechanical system (MEMS) switch. The source to drain voltage capability of the LHV-MOSFET may be increased by using an intrinsic material between the source and the drain. The gate voltage capability of the LHV-MOSFET may be increased by using an insulator material, such as a thick oxide, between the gate and the channel of the LHV-MOSFET. The reverse breakdown voltage capability of the LHVD may be increased by using an intrinsic material between the anode and the cathode. Similarly, in a lateral high-voltage thyristor (LHVT), such as a lateral high-voltage triac (LHVTR), or a lateral high-voltage Silicon-controlled rectifier (LHV-SCR), the voltage capability of the LHV-SCR may be increased by using an intrinsic material between the anode and the cathode.

The lateral high-voltage devices may be subjected to high voltages, which may damage the low-voltage devices; therefore, the lateral high-voltage devices may be vertically isolated from the low-voltage devices or other high-voltage devices by an insulator layer, which may include Silicon Dioxide or the like. The lateral high-voltage devices may be laterally isolated from the low-voltage devices or other high-voltage devices using deep trench isolation. In one embodiment of the present invention, a Silicon-on-Insulator (SOI) wafer is used to provide the lateral high-voltage devices and the low-voltage devices. The SOI wafer has an SOI insulator layer, which may be used to provide vertical isolation, and an SOI device layer, which may be used to form the lateral high-voltage devices. In an alternate embodiment of the present invention, a traditional semiconductor wafer having a substrate may be used to provide the lateral high-voltage devices and the low-voltage devices. An insulator layer is formed over the substrate to provide the vertical isolation.

A thyristor is a switching semiconductor device that has alternating N-type and P-type semiconductor materials, and has at least one control input for selecting either an "ON" state or an "OFF" state. In a latching thyristor, once a control input has selected the "ON" state, the "ON" state is latched and maintained until an "ON" state current, an "ON" state voltage, or both, drop below a latching threshold, independent of the control input. In a non-latching thyristor, a control input continuously selects either the "ON" state or the "OFF" state. A bipolar thyristor, such as a Triac, may conduct current in a forward direction, a reverse direction, or both. A unipolar thyristor, such as a Silicon-controlled rectifier (SCR), may conduct current in a forward direction only.

Additionally, the present invention relates to integrating high-voltage devices, which may include lateral high-voltage devices, non-lateral high-voltage devices, or both, with other circuitry on a semiconductor wafer, which may be fabricated using low-voltage foundry technology. The other circuitry may include low-voltage devices, such as switching transistors used in logic circuits, computer circuitry, and the like, or other high-voltage devices, such as a MEMS switch. The high-voltage devices may be used to create useful high-voltage circuits, such as level-shifting circuits, input protection circuits, charge pump circuits, switching circuits, latch circuits, latching switch circuits, interface circuits, any combination thereof, or the like. The high-voltage circuits may be controlled by the other circuitry.

FIG. 1 shows a traditional semiconductor wafer 10 having a substrate 12, according to the prior art. An epitaxial device layer 14 is formed over the substrate 12. A source 16 and a drain 18 are formed in the epitaxial device layer 14, and a channel 20 is located between the source 16 and the drain 18. A gate 22 is formed over the channel 20, such that gate oxide 24 separates the gate 22 from the channel 20. The source 16, drain 18, channel 20, gate 22, and gate oxide 24 form a traditional lateral metal oxide semiconductor field effect transistor (MOSFET).

The traditional semiconductor wafer 10 and traditional lateral MOSFET may be fabricated using a low-voltage foundry technology. The source 16 and the drain 18 may include a highly-doped semiconductor material having a carrier concentration greater than about $10^{18}$ cm$^{-3}$, with a typical carrier concentration on the order of about $10^{19}$ cm$^{-3}$. The channel 20 may include a doped semiconductor material having a carrier concentration less than about $10^{18}$ cm$^{-3}$, with a typical carrier concentration on the order of about $10^{17}$ cm$^{-3}$. The gate 22 may include metal, poly-Silicon, other material, or any combination thereof.

One embodiment of the present invention may integrate one or more N-type traditional lateral MOSFET, one or more P-type traditional lateral MOSFET, or both, with one or more high-voltage device using a low-voltage foundry technology. The source 16 and the drain 18 of the N-type traditional lateral MOSFET may include highly-doped N-type semiconductor material having a carrier concentration greater than about $10^{18}$ cm$^{-3}$, with a typical carrier concentration on the order of about $10^{19}$ cm$^{-3}$. The channel 20 of the N-type traditional lateral MOSFET may include doped P-type semiconductor material having a carrier concentration less than about $10^{18}$ cm$^{-3}$, with a typical carrier concentration on the order of about $10^{17}$ cm$^{-3}$. A reverse breakdown voltage of a diode junction formed between the highly-doped N-type semiconductor material and the doped P-type semiconductor material may be less than about 20 volts, with a typical reverse breakdown voltage less than about 10 volts.

The source 16 and the drain 18 of the P-type traditional lateral MOSFET may include highly-doped P-type semiconductor material having a carrier concentration greater than about $10^{18}$ cm$^{-3}$, with a typical carrier concentration on the order of about $10^{19}$ cm$^{-3}$. The channel 20 of the P-type traditional lateral MOSFET may include doped N-type semiconductor material having a carrier concentration less than about $10^{18}$ cm$^{-3}$, with a typical carrier concentration on the order of about $10^{17}$ cm$^{-3}$. A reverse breakdown voltage of a diode junction formed between the highly-doped P-type semiconductor material and the doped N-type semiconductor material may be less than about 20 volts, with a typical reverse breakdown voltage less than about 10 volts.

The low-voltage foundry technology may include a LV-CMOS process, a laterally diffused metal oxide semiconductor (LDMOS) process, both, or the like. Process steps that are compatible with low-voltage foundry technology may be used to fabricate high-voltage devices. Such process steps may include field implanting, N-type threshold voltage adjustments (VTN), P-type threshold voltage adjustments (VTP), high-voltage Pwell (HVPwell) fabrication, high-voltage Nwell (HVNwell) fabrication, any combination thereof, or the like. The HVPwell fabrication, HVNwell fabrication, or both, may use implants.

Figure 2:
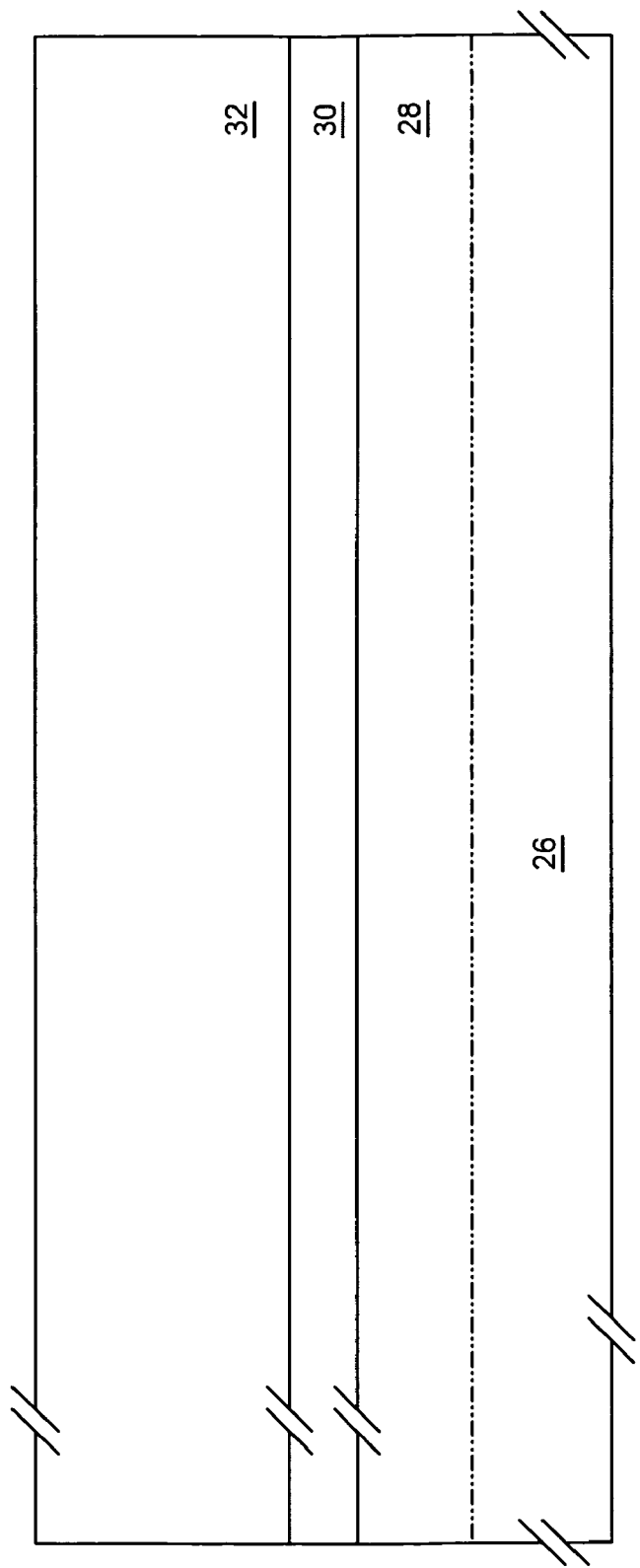
FIG. 2 shows a Silicon-on-Insulator (SOI) wafer, according to one embodiment of the present invention.

FIG. 2 shows an SOI wafer 26 with a substrate 28, according to one embodiment of the present invention. An SOI insulator layer 30 is formed over the substrate 28 and an SOI device layer 32 is formed over the SOI insulator layer 30, which provides electrical isolation between the SOI device layer 32 and the substrate 28. Therefore, a device formed using the SOI device layer 32 is not electrically connected to another device using the SOI device layer 32 through the substrate 28. In one embodiment of the present invention, the SOI insulator layer 30 includes Silicon Dioxide. In an alternate embodiment of the present invention, the SOI insulator layer 30 includes Sapphire. The SOI device layer 32 may include semiconductor material, lightly doped semiconductor material, doped semiconductor material, heavily doped semiconductor material, Silicon, poly-Silicon, lightly doped poly-Silicon, doped poly-Silicon, highly-doped poly-Silicon, or any combination thereof. The SOI insulator layer 30 may include Silicon Dioxide, Sapphire, other oxides, at least one other insulating material, any combination thereof, or the like. The SOI wafer 26 may be used to provide high-voltage devices, such as MOSFETs.

Figure 3A:
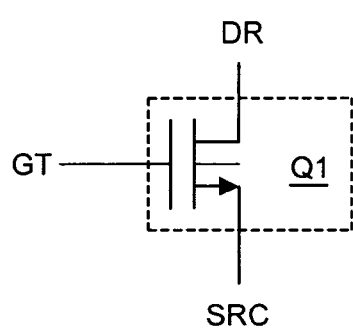
FIG. 3A shows a schematic symbol for an isolated N-type MOSFET, according to one embodiment of the present invention.
Figure 3B:
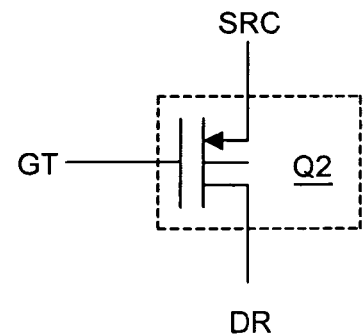
FIG. 3B shows a schematic symbol for an isolated P-type MOSFET, according to an alternate embodiment of the present invention.

FIG. 3A shows a schematic symbol for an isolated N-type MOSFET Q1, according to one embodiment of the present invention. The schematic symbol shows a drain DR, a source SRC, and a gate GT. Since the N-type MOSFET Q1 is isolated, a body connection may be shown as an open circuit, or may be omitted. FIG. 3B shows a schematic symbol for an isolated P-type MOSFET Q2, according to an alternate embodiment of the present invention. The schematic symbol is similar to the schematic symbol for the isolated N-type MOSFET Q1 illustrated in FIG. 3A, and shows a drain DR, a source SRC, and a gate GT. In additional embodiments of the present invention, the isolated N-type MOSFET Q1, the isolated P-type MOSFET Q2, or both may have bodies that are isolated; however, their corresponding body connections may be coupled to other nodes, such as their respective sources SRC.

Figure 4:
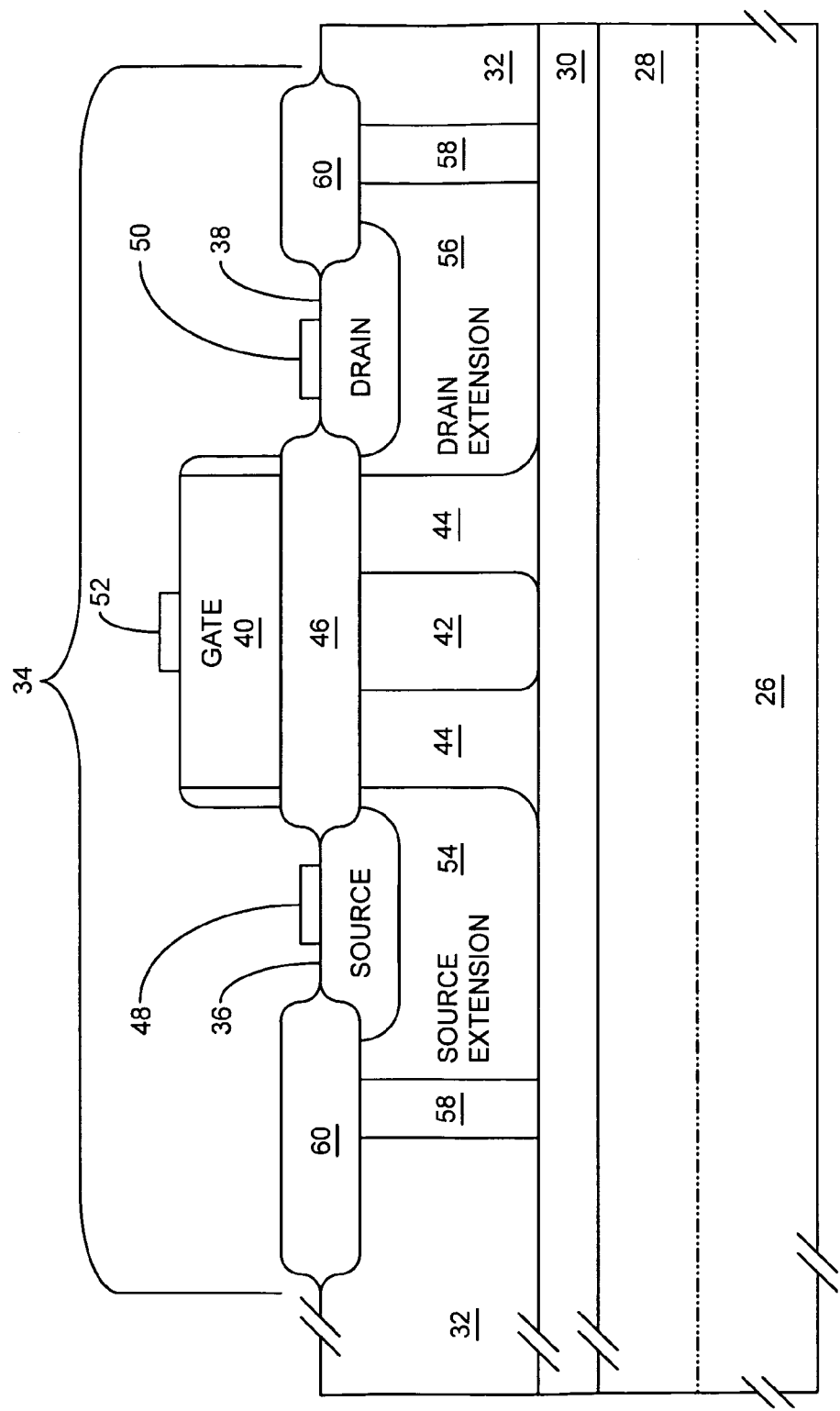
FIG. 4 shows one embodiment of a lateral high-voltage metal oxide semiconductor field effect transistor (LHV-MOSFET) provided by the SOI wafer illustrated in FIG. 2.

FIG. 4 shows one embodiment of an LHV-MOSFET 34 provided by the SOI wafer 26 illustrated in FIG. 2. The LHV-MOSFET 34 may be associated with either of the schematic symbols illustrated in FIGS. 3A and 3B, and is formed from the SOI device layer 32 and includes a source 36, a drain 38, and a gate 40. A channel 42 is formed between the source 36 and the drain 38. Intrinsic material 44 is included between the channel 42 and the source 36, the channel 42 and the drain 38, or both, to increase a breakdown voltage between the source 36 and the drain 38. The intrinsic material 44 may be non-doped or lightly doped semiconductor material. In an exemplary embodiment of the present invention, the intrinsic material 44 may have a resistivity greater than about one ohm·centimeter. In an alternate embodiment of the present invention, the intrinsic material 44 may have a resistivity greater than about one-half ohm·centimeter. In an additional embodiment of the present invention, the intrinsic material 44 may have a resistivity greater than about two ohm·centimeter. In an exemplary embodiment of the present invention, a breakdown voltage between the drain 38 and the source 36 is greater than about 50 volts. In an alternate embodiment of the present invention, a breakdown voltage between the drain 38 and the source 36 is greater than about 20 volts. In an additional embodiment of the present invention, a breakdown voltage between the drain 38 and the source 36 is greater than about 100 volts.

Gate insulation material 46 insulates the gate 40 from the channel 42. The gate insulation material 46 must be thick enough to provide sufficient breakdown voltage between the gate 40 and the channel 42; however, the gate insulation material 46 must be thin enough to provide a thick enough channel 42 for proper operation. In an exemplary embodiment of the present invention, the gate insulation material 46 is Silicon Dioxide having a thickness of about 3000 angstroms. In an exemplary embodiment of the present invention, a breakdown voltage between the gate 40 and the channel 42 is greater than about 50 volts. In an alternate embodiment of the present invention, a breakdown voltage between the gate 40 and the channel 42 is greater than about 20 volts. In an additional embodiment of the present invention, a breakdown voltage between the gate 40 and the channel 42 is greater than about 100 volts.

The source 36 may include highly-doped semiconductor material having a carrier concentration greater than about $10^{18}$ cm$^{-3}$, with a typical carrier concentration on the order of about $10^{19}$ cm$^{-3}$. A metallic source connection 48 may provide an electrical connection to the source 36. The drain 38 may include highly-doped semiconductor material having a carrier concentration greater than about $10^{18}$ cm$^{-3}$, with a typical carrier concentration on the order of about $10^{19}$ cm$^{-3}$. A metallic drain connection 50 may provide an electrical connection to the drain 38. Highly doped semiconductor material may provide an effective electrical interface to metallic connections. The channel 42 may include a doped semiconductor material having a carrier concentration less than about $10^{18}$ cm$^{-3}$, with a typical carrier concentration on the order of about $10^{17}$ cm$^{-3}$.

Normally, the source 36 is of the same doping type as the drain 38, and the channel 42 is of a complementary doping type to the source 36 and drain 38. For example, an N-type LHV-MOSFET 34 may have an N-type source 36, an N-type drain 38, and a P-type channel 42, which may be formed from a Pwell. Further, a P-type LHV-MOSFET 34 may have a P-type source 36, a P-type drain 38, and an N-type channel 42, which may be formed from an Nwell.

The gate 40 may include poly-Silicon, lightly doped poly-Silicon, doped poly-Silicon, highly-doped poly-Silicon, metal, or any combination thereof. In a first exemplary embodiment of the present invention, the gate 40 includes N-type poly-Silicon. In a second exemplary embodiment of the present invention, the gate 40 includes P-type poly-Silicon. A metallic gate connection 52 may provide an electrical connection to the gate 40.

A source extension 54 may extend the source 36 toward the SOI insulator layer 30 and the channel 42. Normally, the source extension 54 is of the same doping type as the source 36. For example, an N-type source 36 would normally have an N-type source extension 54, which may be formed from an Nwell, and a P-type source 36 would normally have a P-type source extension 54, which may be formed from a Pwell. The source extension 54 may separate the source 36 from the intrinsic material 44, from the SOI insulator layer 30, or both. The source extension 54 may separate the source 36 from the channel 42. The source extension 54 may include a doped semiconductor material having a carrier concentration less than about $10^{18}$ cm$^{-3}$, with a typical carrier concentration on the order of about $10^{17}$ cm$^{-3}$.

A drain extension 56 may extend the drain 38 toward the SOI insulator layer 30 and the channel 42. Normally, the drain extension 56 is of the same doping type as the drain 38. For example, an N-type drain 38 would normally have an N-type drain extension 56, which may be formed from an Nwell, and a P-type drain 38 would normally have a P-type drain extension 56, which may be formed from a Pwell. The drain extension 56 may separate the drain 38 from the intrinsic material 44, from the SOI insulator layer 30, or both. The drain extension 56 may separate the drain 38 from the channel 42. The drain extension 56 may include a doped semiconductor material having a carrier concentration less than about $10^{18}$ cm$^{-3}$, with a typical carrier concentration on the order of about $10^{17}$ cm$^{-3}$.

Deep trench isolation (DTI) may be used to form isolation trenches 58 in the SOI device layer 32 down to the SOI insulator layer 30 to laterally isolate the LHV-MOSFET 34 from other devices that may be formed using the SOI device layer 32. The combination of the isolation trenches 58 and the SOI insulator layer 30 may provide complete isolation of the LHV-MOSFET 34 from other devices. In an exemplary embodiment of the present invention, a breakdown voltage between the LHV-MOSFET 34 and an adjacent device (not shown) is greater than about 50 volts. In an alternate embodiment of the present invention, a breakdown voltage between the LHV-MOSFET 34 and the adjacent device is greater than about 20 volts. In an additional embodiment of the present invention, a breakdown voltage between the LHV-MOSFET 34 and the adjacent device is greater than about 100 volts.

A local oxidation of Silicon (LOCOS) layer 60 may be formed into the SOI device layer 32 using thermal oxidation or other techniques to isolate, protect, or both, devices formed in the SOI device layer 32 from any layers formed over or any material adjacent to the LOCOS layer 60. The LOCOS layer 60 may be used to form all or part of the gate insulation material 46. Alternatively, the gate insulation material 46 may be formed from shallow trench isolation (STI), from other methods, or any combination thereof. The gate insulation material 46 may include Silicon Dioxide, other oxides, at least one other insulating material, any combination thereof, or the like.

In a first exemplary embodiment of the present invention, the LHV-MOSFET 34 is an N-type MOSFET and may have a source 36 that includes highly-doped N-type semiconductor material, a drain 38 that includes highly-doped N-type semiconductor material, a channel 42 that includes doped P-type semiconductor material, a source extension 54 that includes doped N-type semiconductor material, and a drain extension 56 that includes doped N-type semiconductor material. FIG. 4 shows a cross-section of the LHV-MOSFET 34. However, the LHV-MOSFET 34 may include a body connection (not shown), which may be located at an end of the gate 40 in a plane that is in front of, behind, or both, the plane of the cross-section illustrated in FIG. 4. The body connection may include highly-doped P-type semiconductor material.

In a second exemplary embodiment of the present invention, the LHV-MOSFET 34 is a P-type MOSFET and may have a source 36 that includes highly-doped P-type semiconductor material, a drain 38 that includes highly-doped P-type semiconductor material, a channel 42 that includes doped N-type semiconductor material, a source extension 54 that includes doped P-type semiconductor material, and a drain extension 56 that includes doped P-type semiconductor material. The LHV-MOSFET 34 may include a body connection (not shown), which may be located at an end of the gate 40 in a plane that is in front of, behind, or both, the plane of the cross-section illustrated in FIG. 4. The body connection may include highly-doped N-type semiconductor material.

Figure 5:
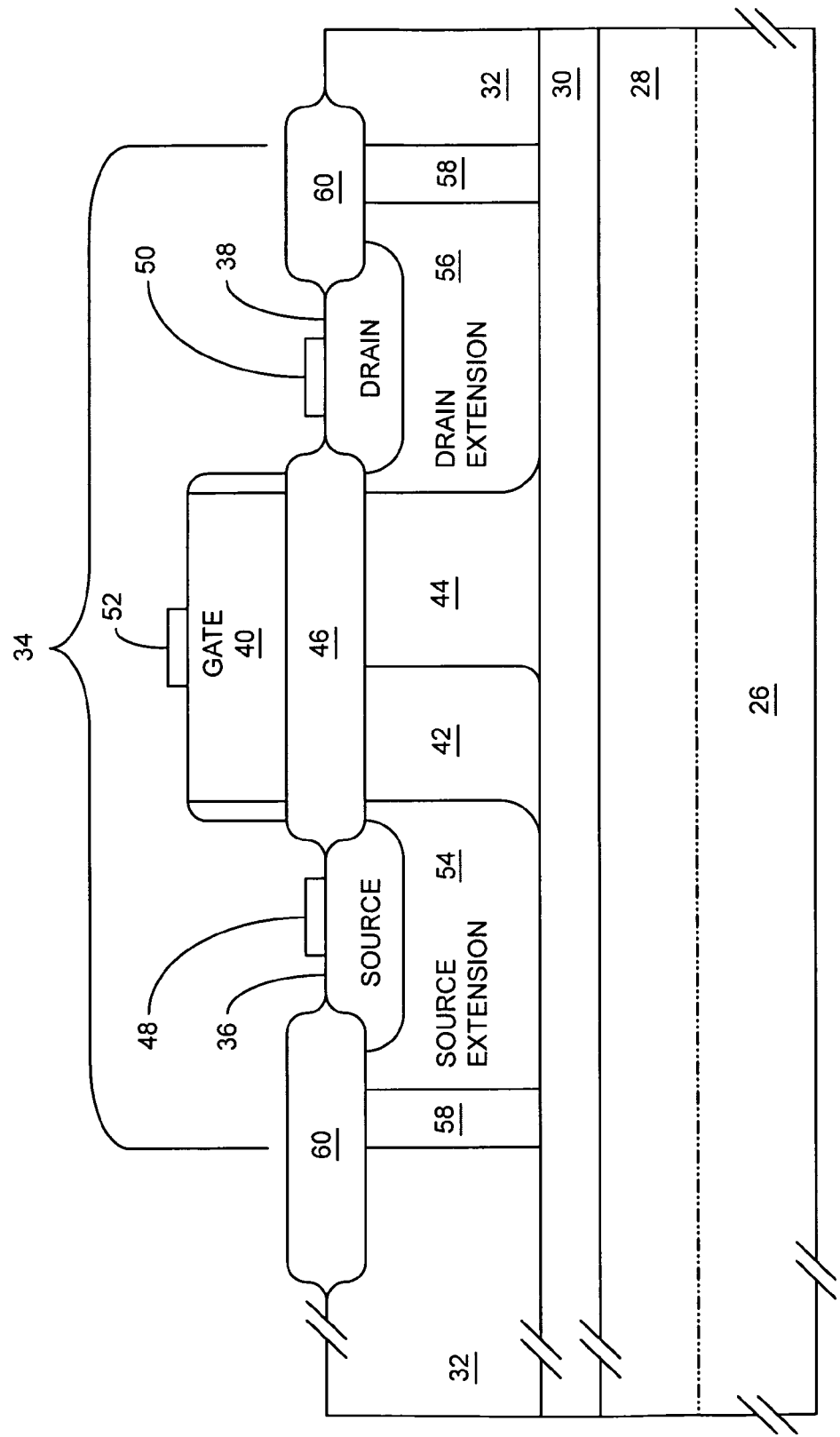
FIG. 5 shows an alternate embodiment of an LHV-MOSFET.

FIG. 5 shows an alternate embodiment of an LHV-MOSFET 34. The channel 42 is located between the source extension 54 and the intrinsic material 44, which is adjacent to the drain extension 56. Typically, when the LHV-MOSFET 34 is in an "OFF" state, a diode junction between the channel 42 and the drain extension 56 is reverse biased for both N-type and P-type LHV-MOSFETs 34. For example, in an N-type LHV-MOSFET 34, the drain 38, drain extension 56, source 36, and source extension 54, may all be N-type material, and the channel 42 may be P-type material. In an N-type MOS- FET, the drain 38 is normally at a higher voltage than the source 36; therefore, the diode junction formed between the channel 42 and the source extension 54 may be forward biased, and the diode junction formed between the channel 42 and the drain extension 56 may be reverse biased. If the LHV-MOSFET 34 has a body (not shown) with a body connection (not shown) that is connected to the source 36, then the channel 42 and the source 36 may have about the same potential, and the drain 38 and the body may be reverse biased.

Likewise, in a P-type LHV-MOSFET 34, the drain 38, drain extension 56, source 36, and source extension 54, may all be P-type material, and the channel 42 may be N-type material. In a P-type MOSFET, the drain 38 is normally at a lower voltage than the source 36; therefore, the diode junction formed between the channel 42 and the source extension 54 may be forward biased, and the diode junction formed between the channel 42 and the drain extension 56 may be reverse biased. If the LHV-MOSFET 34 has a body (not shown) with a body connection (not shown) that is connected to the source 36, then the channel 42 and the source 36 may have about the same potential, and the drain 38 and the body may be reverse biased. Therefore, most of the voltage between the source 36 and the drain 38 when the LHV-MOSFET 34 is in the "OFF" state appears across the channel 42 and the drain extension 56. By adding the intrinsic material 44 between the channel 42 and the drain extension 56, the breakdown voltage of the resulting reverse biased diode junction is increased.

Figure 6:
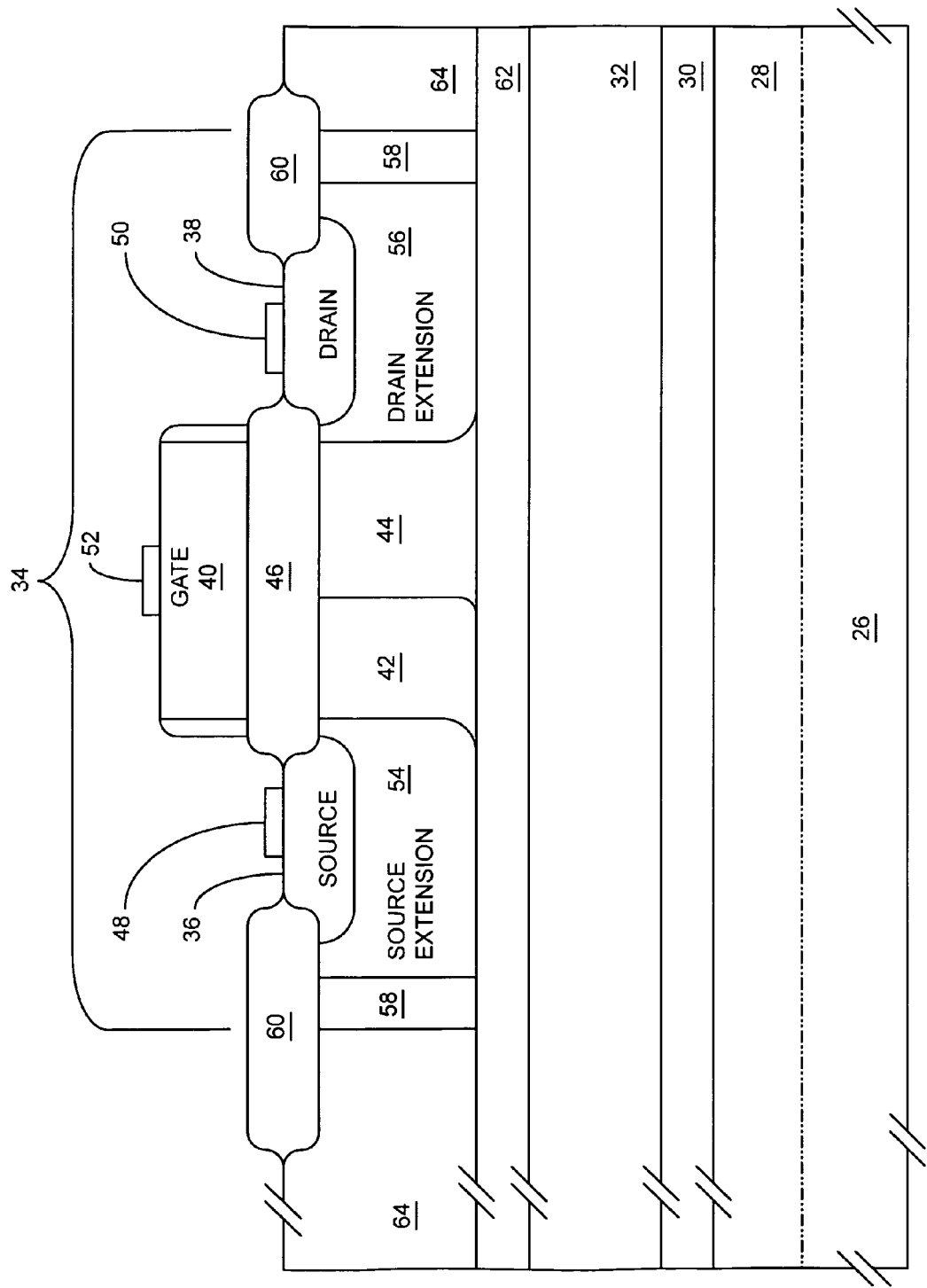
FIG. 6 shows the LHV-MOSFET illustrated in FIG. 5 provided by an insulator layer and an epitaxial layer, both of which are added to the SOI wafer.

FIG. 6 shows the LHV-MOSFET 34 illustrated in FIG. 5 provided by an insulator layer 62 and an epitaxial layer 64, both of which are added to the SOI wafer 26. The insulator layer 62 may be formed over the SOI device layer 32 and the epitaxial layer 64 may be formed over the insulator layer 62. Instead of forming the LHV-MOSFET 34 from the SOI device layer 32 as illustrated in FIG. 5, the LHV-MOSFET 34 is formed from the epitaxial layer 64 and includes the source 36, the drain 38, and the gate 40. In one embodiment of the present invention, the insulator layer 62 may be formed directly over the SOI device layer 32. Alternate embodiments of the present invention may include one or more additional layers between the insulator layer 62 and the SOI device layer 32. The insulator layer 62 may include Silicon Dioxide, Sapphire, other oxides, at least one other insulating material, any combination thereof, or the like. The epitaxial layer 64 may include semiconductor material, lightly doped semiconductor material, doped semiconductor material, heavily doped semiconductor material, Silicon, poly-Silicon, lightly doped poly-Silicon, doped poly-Silicon, highly-doped poly-Silicon, or any combination thereof. DTI may be used to form the isolation trenches 58 in the epitaxial layer 64 down to the insulator layer 62 to laterally isolate the LHV-MOSFET 34 from other devices that may be formed using the epitaxial layer 64. The combination of the isolation trenches 58 and the insulator layer 62 may provide complete isolation of the LHV-MOSFET 34 from other devices.

Figure 7:
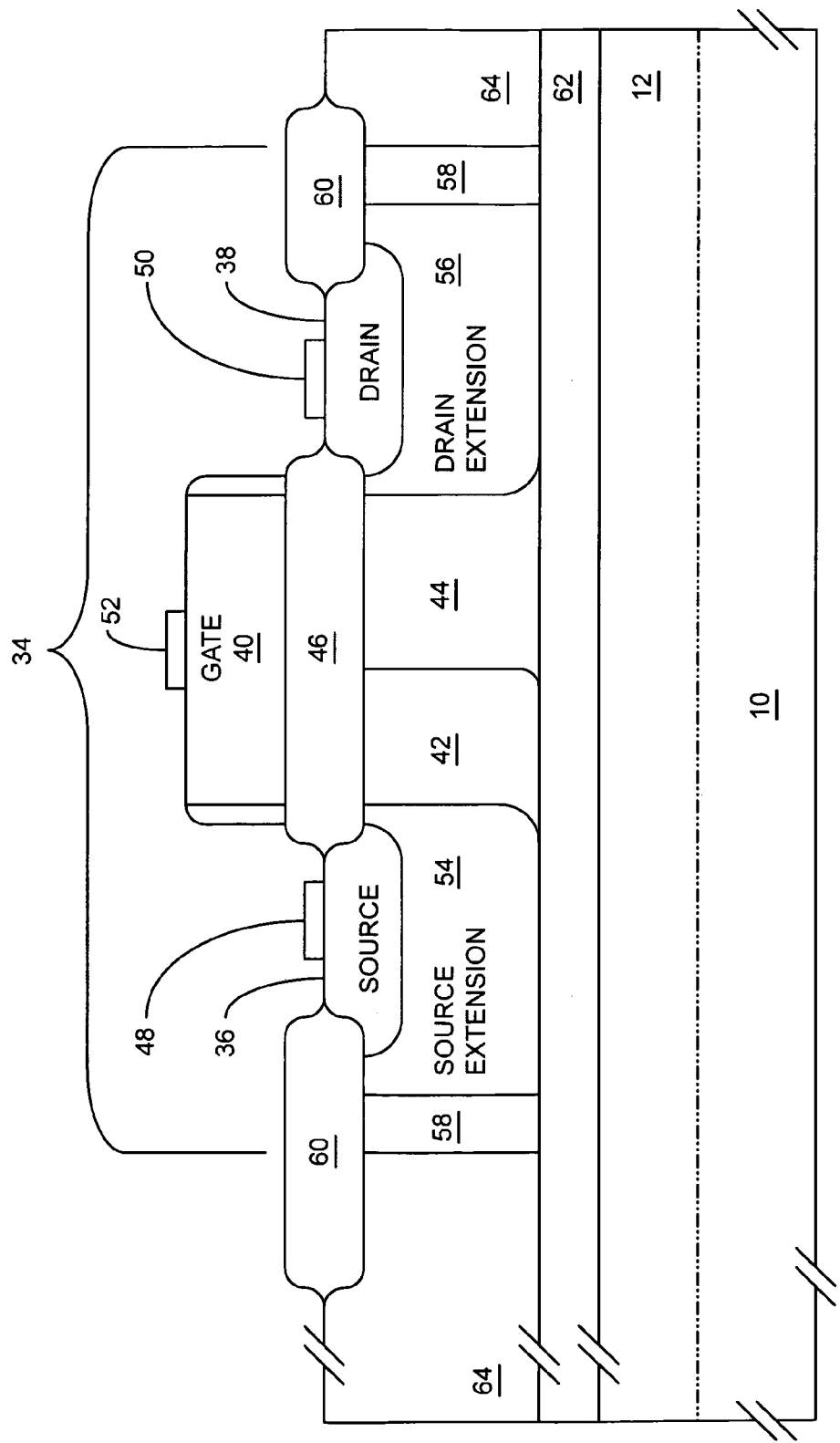
FIG. 7 shows the LHV-MOSFET illustrated in FIG. 5 provided by the insulator layer and the epitaxial layer, both of which are added to the traditional semiconductor wafer.

FIG. 7 shows the LHV-MOSFET 34 illustrated in FIG. 5 provided by the insulator layer 62 and the epitaxial layer 64, both of which are added to the traditional semiconductor wafer 10. The insulator layer 62 may be formed over the substrate 12 and the epitaxial layer 64 may be formed over the insulator layer 62. Instead of forming the LHV-MOSFET 34 from the SOI device layer 32 as illustrated in FIG. 5, the LHV-MOSFET 34 is formed from the epitaxial layer 64 and includes the source 36, the drain 38, and the gate 40. In one embodiment of the present invention, the insulator layer 62 may be formed directly over the substrate 12. Alternate embodiments of the present invention may include one or more additional layers between the insulator layer 62 and the substrate 12. The insulator layer 62 may include Silicon Dioxide, Sapphire, other oxides, at least one other insulating material, any combination thereof, or the like. The epitaxial layer 64 may include semiconductor material, lightly doped semiconductor material, doped semiconductor material, heavily doped semiconductor material, Silicon, poly-Silicon, lightly doped poly-Silicon, doped poly-Silicon, highly-doped poly-Silicon, or any combination thereof. DTI may be used to form the isolation trenches 58 in the epitaxial layer 64 down to the insulator layer 62 to laterally isolate the LHV-MOSFET 34 from other devices that may be formed using the epitaxial layer 64. The combination of the isolation trenches 58 and the insulator layer 62 may provide complete isolation of the LHV-MOSFET 34 from other devices.

Figure 8:
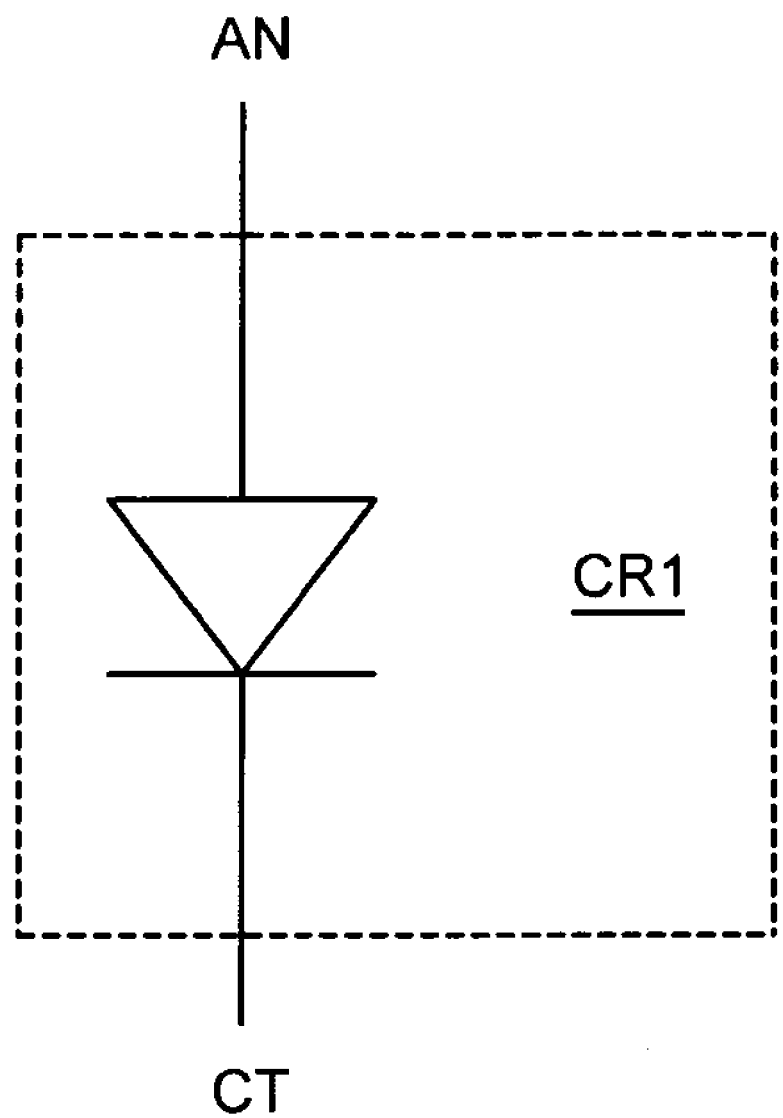
FIG. 8 shows a schematic symbol for a diode.

FIG. 8 shows a schematic symbol for a diode CR1, which has an anode AN and a cathode CT. The diode CR1 may be forward biased when a voltage at the anode AN is greater than a voltage at the cathode CT, and may be reverse biased when the voltage at the anode AN is less than the voltage at the cathode CT. High-voltage circuitry may require one or more high-voltage diodes for input protection, charge pump circuitry, or the like.

Figure 9:
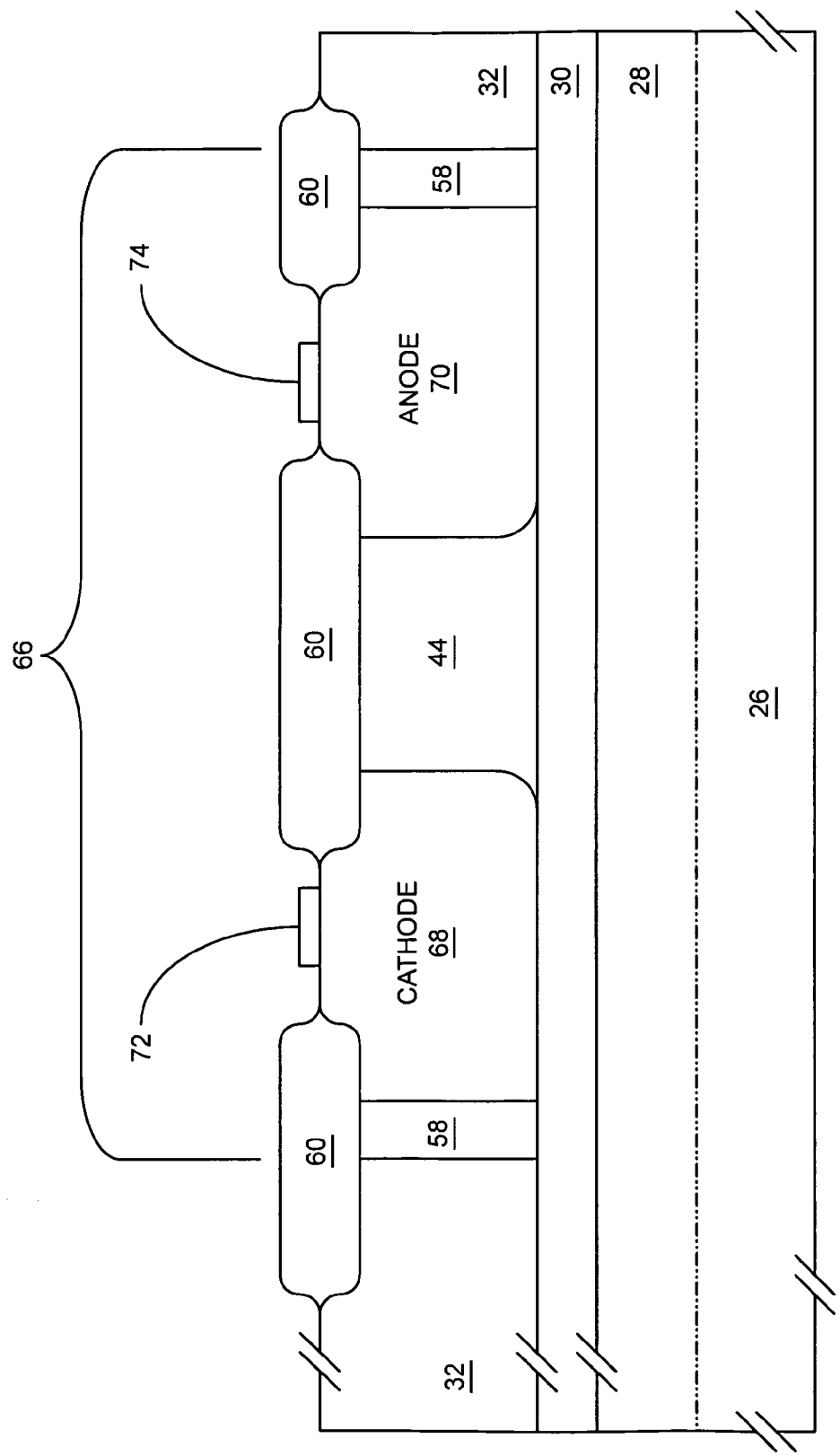
FIG. 9 shows a lateral high-voltage diode (LHVD) provided by the SOI wafer illustrated in FIG. 2, according to one embodiment of the present invention.

FIG. 9 shows an LHVD 66, which may be associated with the schematic symbol illustrated in FIG. 8, and may be provided by the SOI wafer 26 illustrated in FIG. 2, according to one embodiment of the present invention. The LHVD 66 may be formed from the SOI device layer 32 and includes a cathode 68 and an anode 70. Intrinsic material 44 may be included between the cathode 68 and the anode 70 to increase reverse breakdown voltage between the cathode 68 and the anode 70 when the LHVD 66 is reverse biased. The intrinsic material 44 may be non-doped or lightly doped semiconductor material. In an exemplary embodiment of the present invention, the intrinsic material 44 may have a resistivity greater than about one ohm·centimeter. In an alternate embodiment of the present invention, the intrinsic material 44 may have a resistivity greater than about one-half ohm·centimeter. In an additional embodiment of the present invention, the intrinsic material 44 may have a resistivity greater than about two ohm·centimeter. In an exemplary embodiment of the present invention, a reverse breakdown voltage between the cathode 68 and the anode 70 is greater than about 50 volts. In an alternate embodiment of the present invention, a reverse breakdown voltage between the cathode 68 and the anode 70 is greater than about 20 volts. In an additional embodiment of the present invention, a reverse breakdown voltage between the cathode 68 and the anode 70 is greater than about 100 volts.

Normally, the cathode 68 is of an opposite doping type from the anode 70. For example, an LHVD 66 may have an N-type cathode 68 and a P-type anode 70. In one embodiment of the present invention, the cathode 68 may include N-type highly-doped semiconductor material having a carrier concentration greater than about $10^{18}$ cm$^{-3}$, with a typical carrier concentration on the order of about $10^{19}$ cm$^{-3}$. A metallic cathode connection 72 may provide an electrical connection to the cathode 68. The anode 70 may include P-type highly-doped semiconductor material having a carrier concentration greater than about $10^{18}$ cm$^{-3}$, with a typical carrier concentration on the order of about $10^{19}$ cm$^{-3}$. A metallic anode connection 74 may provide an electrical connection to the anode 70. Highly doped semiconductor material may provide an effective electrical interface to metallic connections.

In an alternate embodiment of the present invention, the cathode 68 may include N-type doped semiconductor material having a carrier concentration less than about $10^{18}$ cm$^{-3}$, with a typical carrier concentration on the order of about $10^{17}$ cm$^{-3}$. The cathode 68 may be provided by an Nwell. The anode 70 may include P-type doped semiconductor material having a carrier concentration less than about $10^{18}$ cm$^{-3}$, with a typical carrier concentration on the order of about $10^{17}$ cm$^{-3}$. The anode 70 may be provided by a Pwell.

DTI may be used to form isolation trenches 58 in the SOI device layer 32 down to the SOI insulator layer 30 to laterally isolate the LHVD 66 from other devices that may be formed using the SOI device layer 32. The combination of the isolation trenches 58 and the SOI insulator layer 30 may provide complete isolation of the LHVD 66 from other devices. In an exemplary embodiment of the present invention, a breakdown voltage between the LHVD 66 and an adjacent device (not shown) is greater than about 50 volts. In an alternate embodiment of the present invention, a breakdown voltage between the LHVD 66 and the adjacent device is greater than about 20 volts. In an additional embodiment of the present invention, a breakdown voltage between the LHVD 66 and the adjacent device is greater than about 100 volts. A LOCOS layer 60 may be formed into the SOI device layer 32 using thermal oxidation or other techniques to isolate, protect, or both, devices formed in the SOI device layer 32 from any layers formed over or any material adjacent to the LOCOS layer 60.

Figure 10:
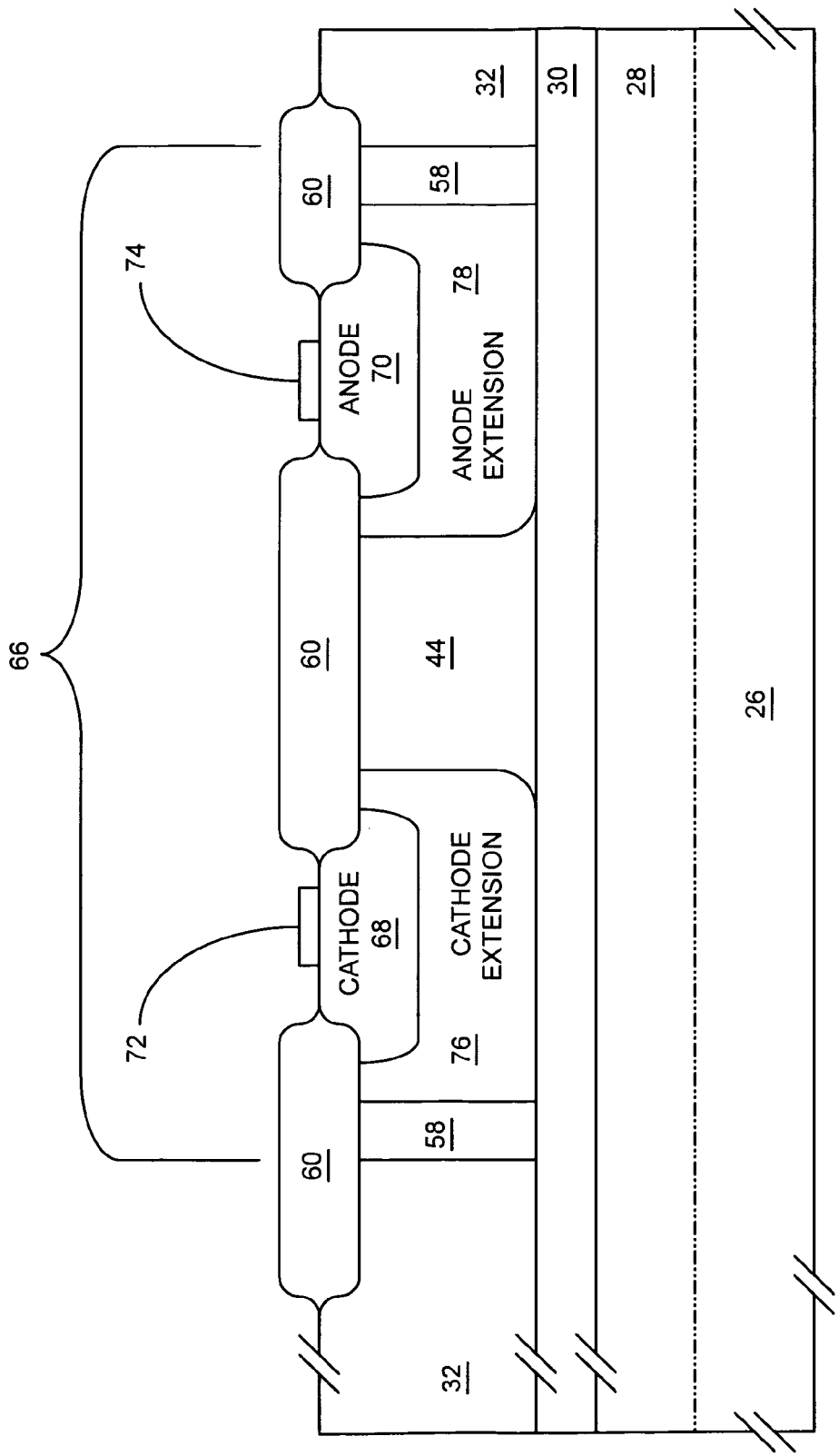
FIG. 10 shows the LHVD provided by the SOI wafer illustrated in FIG. 2, according to an alternate embodiment of the present invention.

FIG. 10 shows the LHVD 66 provided by the SOI wafer 26 illustrated in FIG. 2, according to an alternate embodiment of the present invention. The LHVD 66 may be formed from the SOI device layer 32 and includes the cathode 68, a cathode extension 76, the anode 70, and an anode extension 78. Intrinsic material 44 may be included between the cathode 68 and the anode 70 to increase reverse breakdown voltage between the cathode 68 and the anode 70 when the LHVD 66 is reverse biased. The intrinsic material 44 may be non-doped or lightly doped semiconductor material. In an exemplary embodiment of the present invention, the intrinsic material 44 may have a resistivity greater than about one ohm·centimeter. In an alternate embodiment of the present invention, the intrinsic material 44 may have a resistivity greater than about one-half ohm·centimeter. In an additional embodiment of the present invention, the intrinsic material 44 may have a resistivity greater than about two ohm·centimeter. In an exemplary embodiment of the present invention, a reverse breakdown voltage between the cathode 68 and the anode 70 is greater than about 50 volts. In an alternate embodiment of the present invention, a reverse breakdown voltage between the cathode 68 and the anode 70 is greater than about 20 volts. In an additional embodiment of the present invention, a reverse breakdown voltage between the cathode 68 and the anode 70 is greater than about 100 volts.

Normally, the cathode 68 is of an opposite doping type from the anode 70. For example, an LHVD 66 may have an N-type cathode 68 and a P-type anode 70. In one embodiment of the present invention, the cathode 68 may include N-type highly-doped semiconductor material having a carrier concentration greater than about $10^{18}$ cm$^{-3}$, with a typical carrier concentration on the order of about $10^{19}$ cm$^{-3}$. A metallic cathode connection 72 may provide an electrical connection to the cathode 68. The anode 70 may include P-type highly-doped semiconductor material having a carrier concentration greater than about $10^{18}$ cm$^{-3}$, with a typical carrier concentration on the order of about $10^{19}$ cm$^{-3}$. A metallic anode connection 74 may provide an electrical connection to the anode 70. Highly doped semiconductor material may provide an effective electrical interface to metallic connections.

The cathode extension 76 may extend the cathode 68 toward the SOI insulator layer 30 and the intrinsic material 44. Normally, the cathode extension 76 is of the same doping type as the cathode 68. The anode extension 78 may extend the anode 70 toward the SOI insulator layer 30 and the intrinsic material 44. Normally, the anode extension 78 is of the same doping type as the anode 70. For example, an N-type cathode 68 would normally have an N-type cathode extension 76, which may be formed from an Nwell, and a P-type anode 70 would normally have a P-type anode extension 78, which may be formed from a Pwell. The cathode extension 76 may separate the cathode 68 from the intrinsic material 44, from the SOI insulator layer 30, or both. The cathode extension 76 may include a doped semiconductor material having a carrier concentration less than about $10^{18}$ cm$^{-3}$, with a typical carrier concentration on the order of about $10^{17}$ cm$^{-3}$. The anode extension 78 may separate the anode 70 from the intrinsic material 44, from the SOI insulator layer 30, or both. The anode extension 78 may include a doped semiconductor material having a carrier concentration less than about $10^{18}$ cm$^{-3}$, with a typical carrier concentration on the order of about $10^{17}$ cm$^{-3}$.

In an alternate embodiment of the present invention, the cathode 68 may include N-type doped semiconductor material having a carrier concentration less than about $10^{18}$ cm$^{-3}$, with a typical carrier concentration on the order of about $10^{17}$ cm$^{-3}$. The cathode 68 may be provided by an Nwell. The anode 70 may include P-type doped semiconductor material having a carrier concentration less than about $10^{18}$ cm$^{-3}$, with a typical carrier concentration on the order of about $10^{17}$ cm$^{-3}$. The anode 70 may be provided by a Pwell.

DTI may be used to form isolation trenches 58 in the SOI device layer 32 down to the SOI insulator layer 30 to laterally isolate the LHVD 66 from other devices that may be formed using the SOI device layer 32. The combination of the isolation trenches 58 and the SOI insulator layer 30 may provide complete isolation of the LHVD 66 from other devices. In an exemplary embodiment of the present invention, a breakdown voltage between the LHVD 66 and an adjacent device (not shown) is greater than about 50 volts. In an alternate embodiment of the present invention, a breakdown voltage between the LHVD 66 and the adjacent device is greater than about 20 volts. In an additional embodiment of the present invention, a breakdown voltage between the LHVD 66 and the adjacent device is greater than about 100 volts. A LOCOS layer 60 may be formed into the SOI device layer 32 using thermal oxidation or other techniques to isolate, protect, or both, devices formed in the SOI device layer 32 from any layers formed over or any material adjacent to the LOCOS layer 60.

Figure 11B:
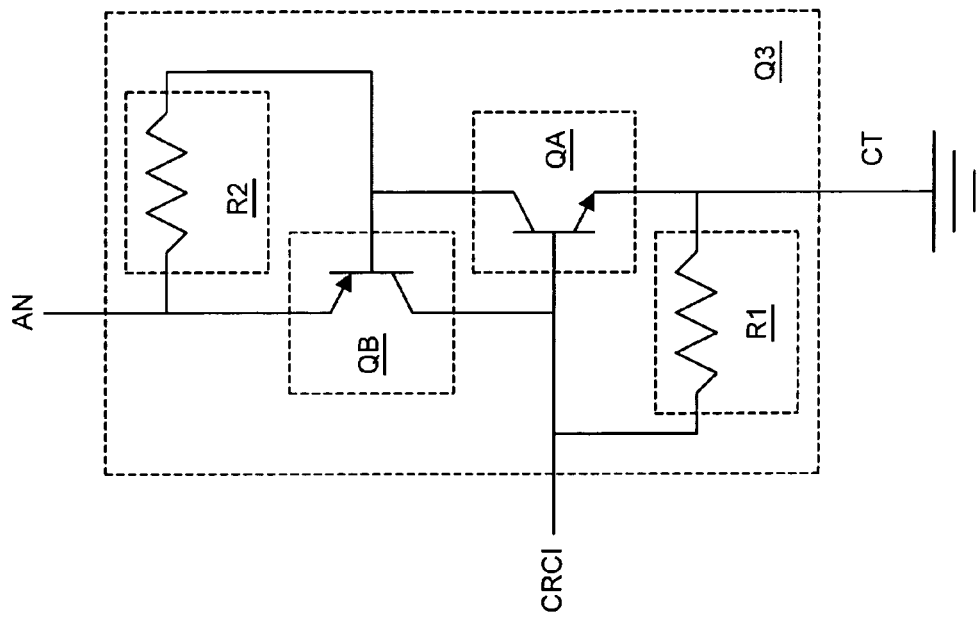
FIGS. 11A and 11B show a schematic symbol and details, respectively, for a cathode-referenced Silicon-controlled rectifier (SCR).
Figure 11A:
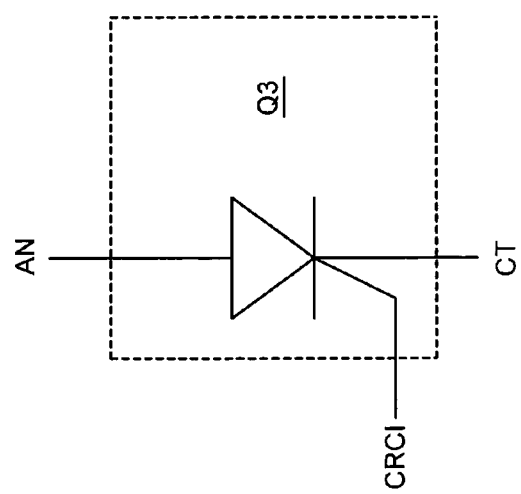

FIG. 11A shows a schematic symbol for a cathode-referenced SCR Q3. An SCR is a unipolar thyristor and may be either latching or non-latching. The cathode-referenced SCR Q3 includes an anode AN, a cathode CT, and a cathode-referenced control input CRCI. FIG. 11B shows details of the cathode-referenced SCR Q3. The emitter of an NPN bipolar transistor element QA is coupled to the cathode CT, the base of the NPN bipolar transistor element QA is coupled to the cathode-referenced control input CRCI, and a first resistive element R1 is coupled between the emitter and the base of the NPN bipolar transistor element QA. The emitter of a PNP bipolar transistor element QB is coupled to the anode AN, the base of the PNP bipolar transistor element QB is coupled to the collector of the NPN bipolar transistor element QA, and a second resistive element R2 is coupled between the emitter and the base of the PNP bipolar transistor element QB.

When the cathode-referenced SCR Q3 is in an "OFF" state, a voltage at the anode AN would normally be positive relative to a voltage at the cathode CT, and the first and second resistive elements R1, R2 keep the NPN and PNP bipolar transistor elements QA, QB in "OFF" states, respectively, thereby preventing any significant current flow from the anode AN to the cathode CT. The cathode-referenced SCR Q3 is switched to an "ON" state by feeding sufficient current into the cathode-referenced control input CRCI, relative to the cathode CT, to switch the NPN bipolar transistor element QA to an "ON" state, forward biasing the base-to-emitter junction of the PNP bipolar transistor element QB, which may switch the PNP bipolar transistor element QB to an "ON" state. Once both bipolar transistor elements QA, QB are in an "ON" state, the collector of each of the bipolar transistor elements QA, QB feeds the base of the other bipolar transistor elements QB, QA. If the gains of the bipolar transistor elements QA, QB, the resistances of the resistive elements R1, R2, and the current fed into the anode AN are all high enough, once the cathode-referenced SCR Q3 is in the "ON" state, the cathode-referenced SCR Q3 remains in the "ON" state without any current being fed into the cathode-referenced control input CRCI. Such a state is called a "latched state" and the cathode-referenced SCR Q3 is a latching cathode-referenced SCR Q3. If the current fed into the anode AN drops below a threshold, then the latching cathode-referenced SCR Q3 may switch from the "latched state" to a "non-latched state," in which both bipolar transistor elements QA, QB switch to an "OFF" state.

If the cathode-referenced SCR Q3 always requires current be fed into the cathode-referenced control input CRCI to switch to the "ON" state, then the cathode-referenced SCR Q3 is a cathode-referenced SCR Q3. Alternate embodiments of the present invention may omit the first resistive element R1, the second resistive element R2, or both. In one embodiment of the present invention, the cathode CT is coupled to ground; therefore, a voltage at the cathode-referenced control input CRCI is normally not more than a base-to-emitter forward voltage drop above ground, which may simplify some circuit designs.

Figure 12B:
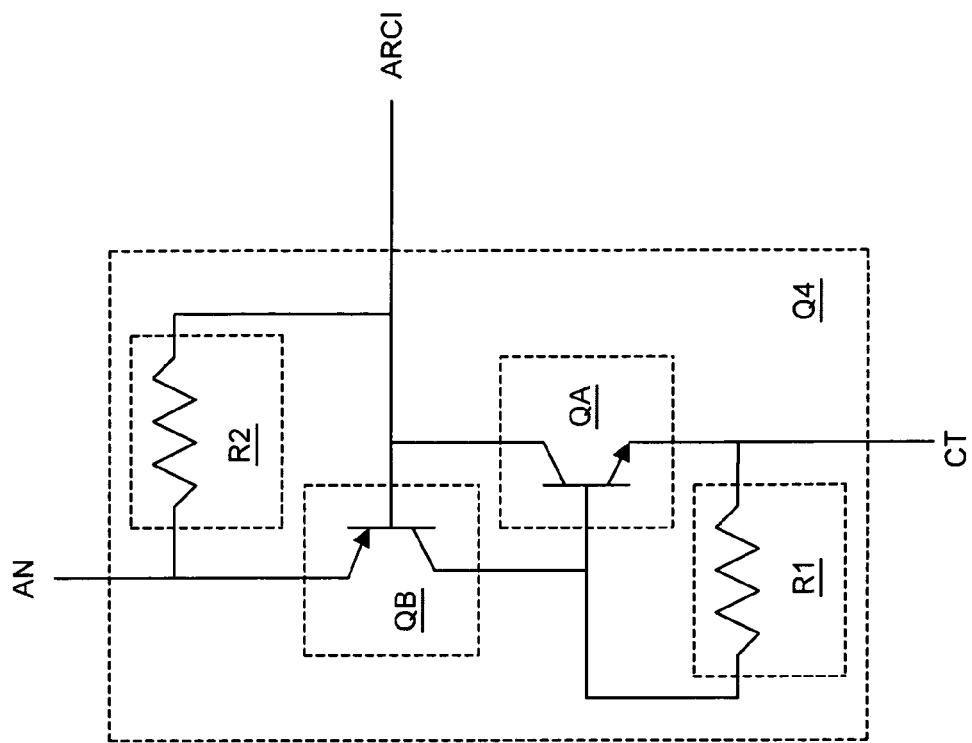
FIGS. 12A and 12B show a schematic symbol and details, respectively, for an anode-referenced SCR.
Figure 12A:
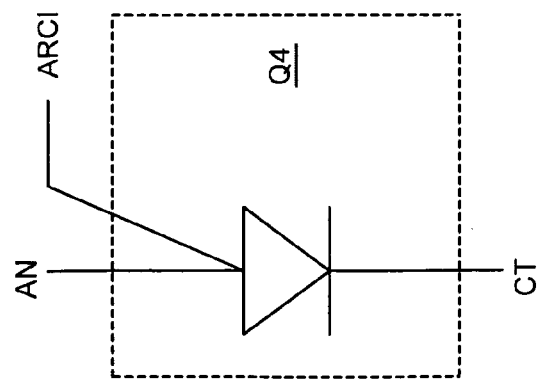

FIGS. 12A and 12B show a schematic symbol and details, respectively, for an anode-referenced SCR Q4. The anode-referenced SCR Q4 is similar to the cathode-referenced SCR Q3 illustrated in FIGS. 11A and 11B, except instead of the cathode-referenced control input CRCI, the anode-referenced SCR Q4 has an anode-referenced control input ARCI coupled to the base of the PNP bipolar transistor element QB. When the anode-referenced SCR Q4 is in an "OFF" state, a voltage at the anode AN would normally be positive relative to a voltage at the cathode CT, and the first and second resistive elements R1, R2 keep the NPN and PNP bipolar transistor elements QA, QB in "OFF" states, respectively, thereby preventing any significant current flow from the anode AN to the cathode CT. The anode-referenced SCR Q4 is switched to an "ON" state by drawing sufficient current out of the anode-referenced control input ARCI, relative to the anode AN, to switch the PNP bipolar transistor element QB to an "ON" state, forward biasing the base-to-emitter junction of the NPN bipolar transistor element QA, which may switch the NPN bipolar transistor element QA to an "ON" state. Once both bipolar transistor elements QA, QB are in an "ON" state, the collector of each of the bipolar transistor elements QA, QB feeds the base of the other bipolar transistor elements QB, QA. The anode-referenced SCR Q4 may be either latching or non-latching. One embodiment of the present invention may include an SCR having both an anode-referenced control input ARCI and a cathode-referenced control input CRCI.

Figure 13:
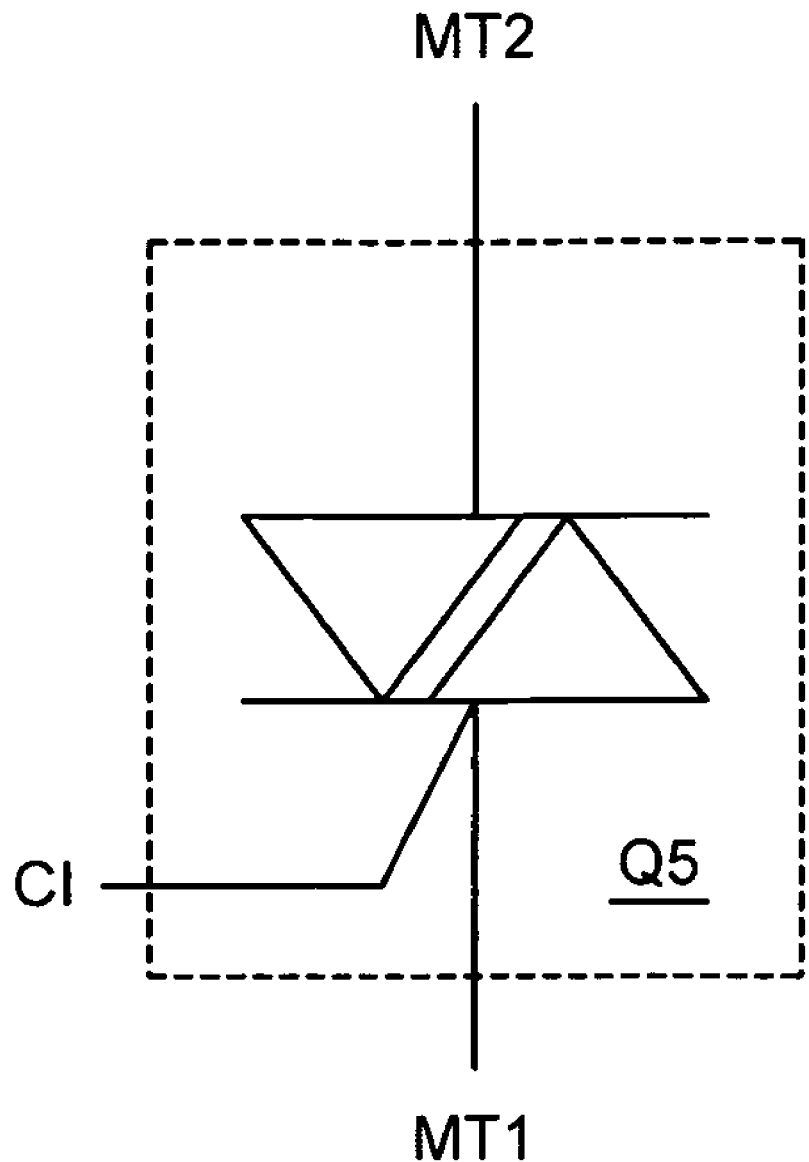
FIG. 13 shows a schematic symbol for a Triac.

FIG. 13 shows a schematic symbol for a Triac Q5. A Triac is a bipolar thyristor, which may conduct current in a forward direction, a reverse direction, or both. The Triac Q5 may include a first main terminal MT1, a second main terminal MT2, and a control input CI. When the Triac Q5 is in an "OFF" state, a voltage at the second main terminal MT2 may be positive relative to a voltage at the first main terminal MT1, or the voltage at the second main terminal MT2 may be negative relative to the voltage at the first main terminal MT1. The Triac Q5 may be switched into an "ON" state by feeding a current either into or out of the control input CI, relative to the first main terminal MT1. The Triac Q5 may be either latching or non-latching.

Figure 14:
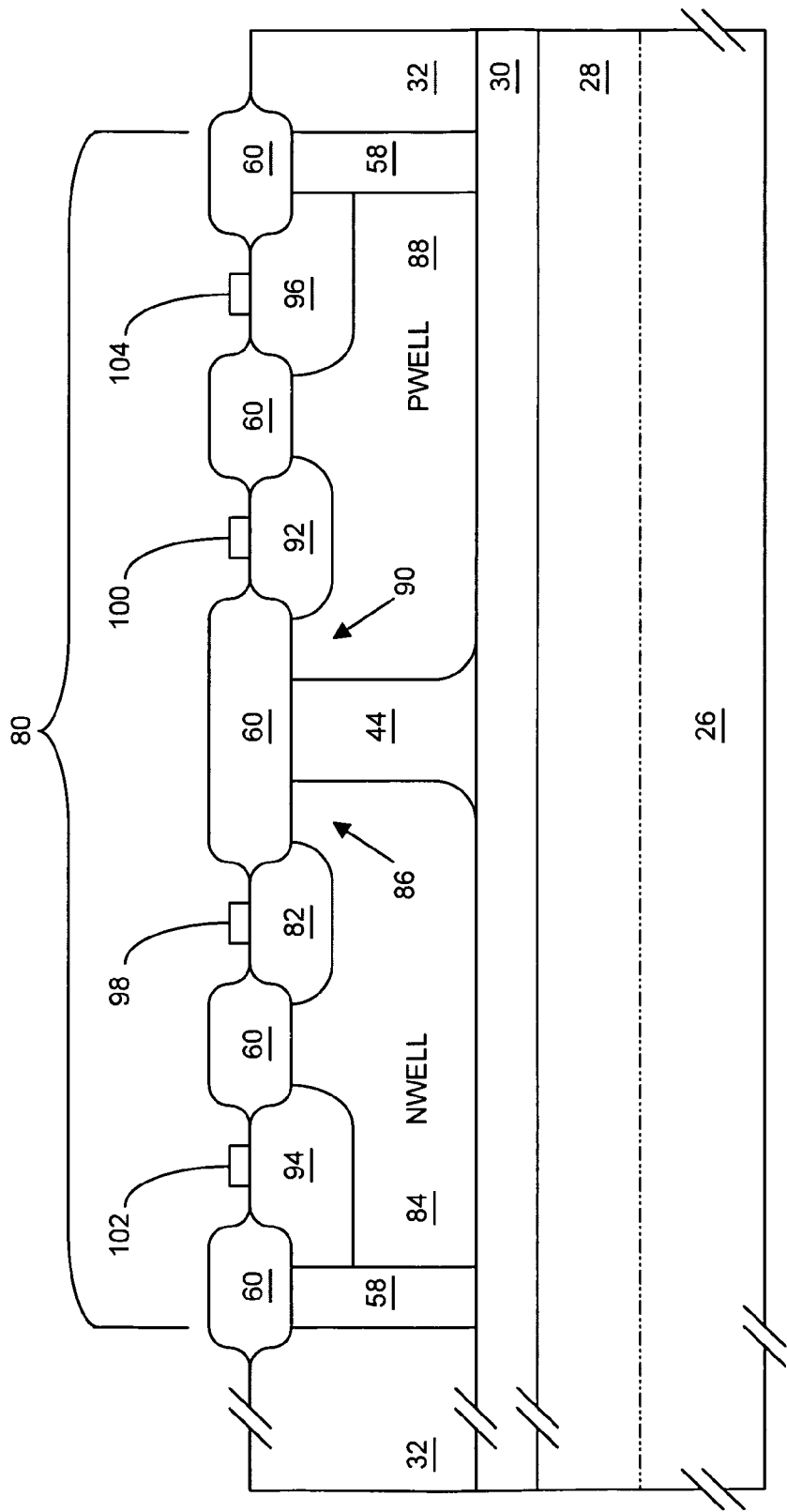
FIG. 14 shows a lateral high-voltage Silicon-controlled rectifier (LHV-SCR) provided by the SOI wafer illustrated in FIG. 2, according to one embodiment of the present invention.

FIG. 14 shows an LHV-SCR 80, which may be associated with either of the schematic symbols illustrated in FIGS. 12A and 12B, and may be provided by the SOI wafer 26 illustrated in FIG. 2, according to one embodiment of the present invention. The LHV-SCR 80 may have an anode-referenced control input ARCI, a cathode-referenced control input CRCI, or both. The LHV-SCR 80 is formed from the SOI device layer 32 and may include a PNP emitter 82, which provides an anode AN, an N-type body 84 that provides a combined PNP base-NPN collector 86, a P-type body 88 that provides a combined NPN base-PNP collector 90, an NPN emitter 92, which provides a cathode CT, an anode-referenced control input 94, and a cathode-referenced control input 96.

Intrinsic material 44 is included between the combined PNP base-NPN collector 86 and the combined NPN base-PNP collector 90 to increase a breakdown voltage between the anode AN and the cathode CT. The intrinsic material 44 may be non-doped or lightly doped semiconductor material. In an exemplary embodiment of the present invention, the intrinsic material 44 may have a resistivity greater than about one ohm·centimeter. In an alternate embodiment of the present invention, the intrinsic material 44 may have a resistivity greater than about one-half ohm·centimeter. In an additional embodiment of the present invention, the intrinsic material 44 may have a resistivity greater than about two ohm·centimeter. In an exemplary embodiment of the present invention, a breakdown voltage between the anode AN and the cathode CT is greater than about 50 volts. In an alternate embodiment of the present invention, a breakdown voltage between the anode AN and the cathode CT is greater than about 20 volts. In an additional embodiment of the present invention, a breakdown voltage between the anode AN and the cathode CT is greater than about 100 volts.

The PNP emitter 82 may include highly-doped P-type semiconductor material having a carrier concentration greater than about $10^{18}$ cm$^{-3}$, with a typical carrier concentration on the order of about $10^{19}$ cm$^{-3}$. A metallic PNP emitter connection 98 may provide an electrical connection to the PNP emitter 82. The NPN emitter 92 may include highly-doped N-type semiconductor material having a carrier concentration greater than about $10^{18}$ cm$^{-3}$, with a typical carrier concentration on the order of about $10^{19}$ cm$^{-3}$. A metallic NPN emitter connection 100 may provide an electrical connection to the NPN emitter 92. The anode-referenced control input 94 may include highly-doped N-type semiconductor material having a carrier concentration greater than about $10^{18}$ cm$^{-3}$, with a typical carrier concentration on the order of about $10^{19}$ cm$^{-3}$. A metallic anode-referenced control input connection 102 may provide an electrical connection to the anode-referenced control input 94. The cathode-referenced control input 96 may include highly-doped P-type semiconductor material having a carrier concentration greater than about $10^{18}$ cm$^{-3}$, with a typical carrier concentration on the order of about $10^{19}$ cm$^{-3}$. A metallic cathode-referenced control input connection 104 may provide an electrical connection to the cathode-referenced control input 96. Highly doped semiconductor material may provide an effective electrical interface to metallic connections.

The N-type body 84 may be formed from an Nwell and may extend toward, reach, or both, the SOI insulator layer 30. The N-type body 84 may separate the anode-referenced control input 94 from the PNP emitter 82. The N-type body 84 may include a doped semiconductor material having a carrier concentration less than about $10^{18}$ cm$^{-3}$, with a typical carrier concentration on the order of about $10^{17}$ cm$^{-3}$. The P-type body 88 may be formed from a Pwell and may extend toward, reach, or both, the SOI insulator layer 30. The P-type body 88 may separate the cathode-referenced control input 96 from the NPN emitter 92. The P-type body 88 may include a doped semiconductor material having a carrier concentration less than about $10^{18}$ cm$^{-3}$, with a typical carrier concentration on the order of about $10^{17}$ cm$^{-3}$. The combined PNP base-NPN collector 86 is between the PNP emitter 82 and the intrinsic material 44, and the combined NPN base-PNP collector 90 is between the NPN emitter 92 and the intrinsic material 44.

DTI may be used to form isolation trenches 58 in the SOI device layer 32 down to the SOI insulator layer 30 to laterally isolate the LHV-SCR 80 from other devices that may be formed using the SOI device layer 32. The combination of the isolation trenches 58 and the SOI insulator layer 30 may provide complete isolation of the LHV-SCR 80 from other devices. In an exemplary embodiment of the present invention, a breakdown voltage between the LHV-SCR 80 and an adjacent device (not shown) is greater than about 50 volts. In an alternate embodiment of the present invention, a breakdown voltage between the LHV-SCR 80 and the adjacent device is greater than about 20 volts. In an additional embodiment of the present invention, a breakdown voltage between the LHV-SCR 80 and the adjacent device is greater than about 100 volts. A LOCOS layer 60 may be formed into the SOI device layer 32 using thermal oxidation or other techniques to isolate, protect, or both, devices formed in the SOI device layer 32 from any layers formed over or any material adjacent to the LOCOS layer 60.

Figure 15:
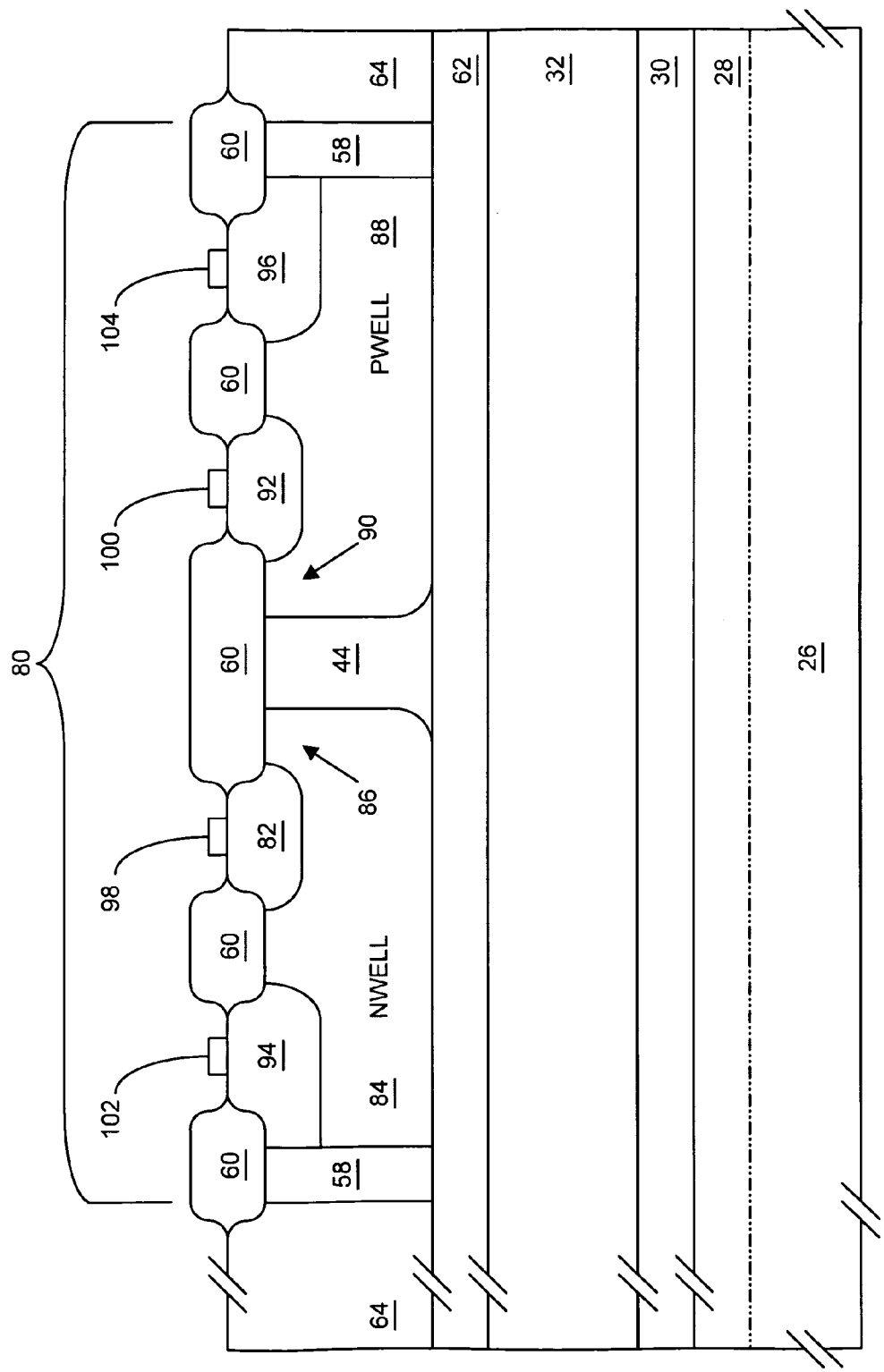
FIG. 15 shows the LHV-SCR illustrated in FIG. 14 provided by an insulator layer and an epitaxial layer, both of which are added to the SOI wafer, according to an alternate embodiment of the present invention.

FIG. 15 shows the LHV-SCR 80 illustrated in FIG. 14 provided by an insulator layer 62 and an epitaxial layer 64, both of which are added to the SOI wafer 26, according to an alternate embodiment of the present invention. The insulator layer 62 may be formed over the SOI device layer 32 and the epitaxial layer 64 may be formed over the insulator layer 62. Instead of forming the LHV-SCR 80 from the SOI device layer 32 as illustrated in FIG. 14, the LHV-SCR 80 is formed from the epitaxial layer 64 and may include the PNP emitter 82, the N-type body 84, the P-type body 88, the NPN emitter 92, the anode-referenced control input 94, and the cathode-referenced control input 96. In one embodiment of the present invention, the insulator layer 62 may be formed directly over the SOI device layer 32. Alternate embodiments of the present invention may include one or more additional layers between the insulator layer 62 and the SOI device layer 32. The insulator layer 62 may include Silicon Dioxide, Sapphire, other oxides, at least one other insulating material, any combination thereof, or the like. The epitaxial layer 64 may include semiconductor material, lightly doped semiconductor material, doped semiconductor material, heavily doped semiconductor material, Silicon, poly-Silicon, lightly doped poly-Silicon, doped poly-Silicon, highly-doped poly-Silicon, or any combination thereof. DTI may be used to form the isolation trenches 58 in the epitaxial layer 64 down to the insulator layer 62 to laterally isolate the LHV-SCR 80 from other devices that may be formed using the epitaxial layer 64. The combination of the isolation trenches 58 and the insulator layer 62 may provide complete isolation of the LHV-SCR 80 from other devices.

Figure 16:
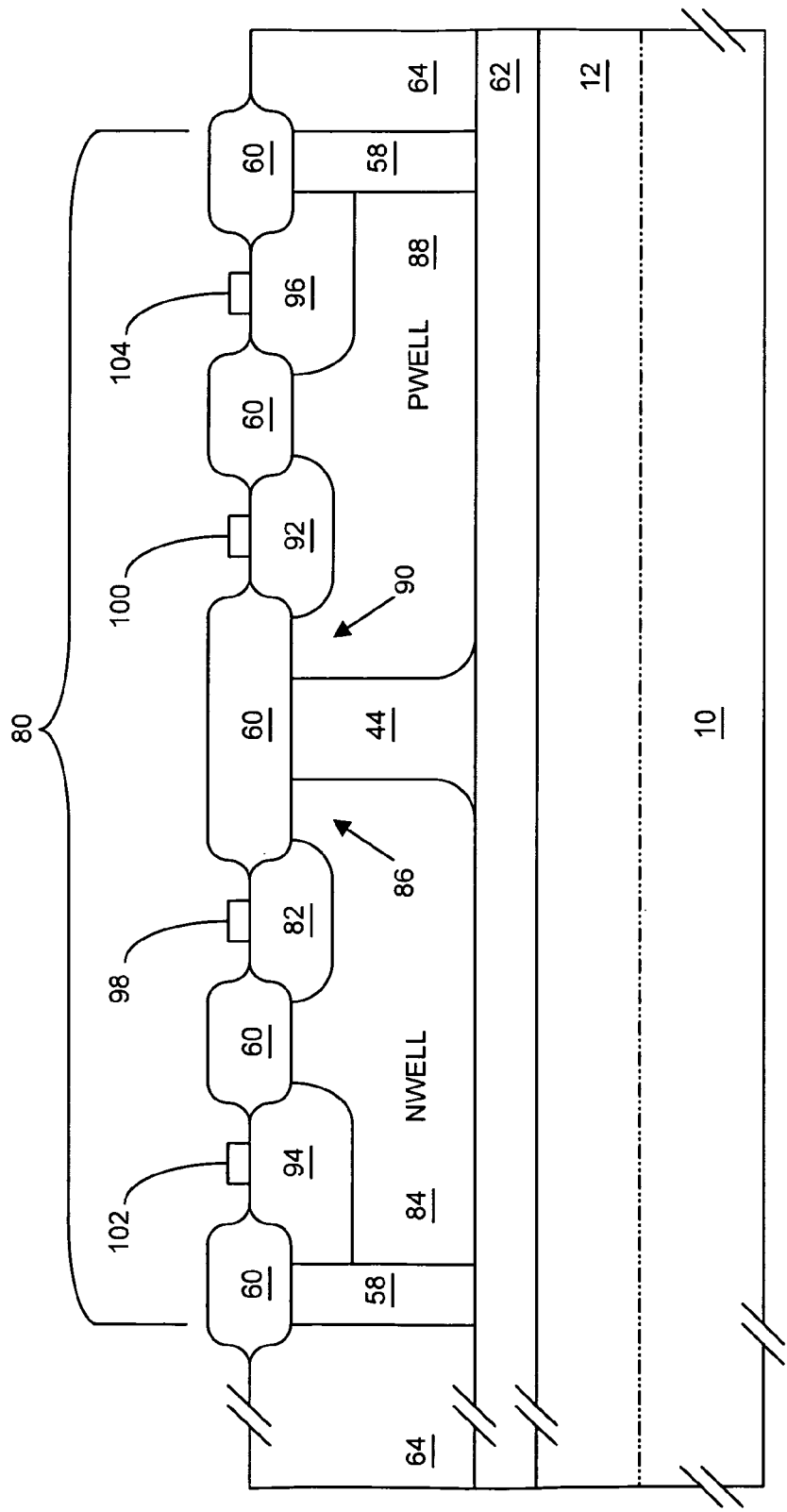
FIG. 16 shows the LHV-SCR illustrated in FIG. 14 provided by the insulator layer and the epitaxial layer, both of which are added to the traditional semiconductor wafer, according to an additional embodiment of the present invention.

FIG. 16 shows the LHV-SCR 80 illustrated in FIG. 14 provided by the insulator layer 62 and the epitaxial layer 64, both of which are added to the traditional semiconductor wafer 10, according to an additional embodiment of the present invention. The insulator layer 62 may be formed over the substrate 12 and the epitaxial layer 64 may be formed over the insulator layer 62. Instead of forming the LHV-SCR 80 from the SOI device layer 32 as illustrated in FIG. 14, the LHV-SCR 80 is formed from the epitaxial layer 64 and includes the PNP emitter 82, the N-type body 84, the P-type body 88, the NPN emitter 92, the anode-referenced control input 94, and the cathode-referenced control input 96. In one embodiment of the present invention, the insulator layer 62 may be formed directly over the substrate 12. Alternate embodiments of the present invention may include one or more additional layers between the insulator layer 62 and the substrate 12. The insulator layer 62 may include Silicon Dioxide, Sapphire, other oxides, at least one other insulating material, any combination thereof, or the like. The epitaxial layer 64 may include semiconductor material, lightly doped semiconductor material, doped semiconductor material, heavily doped semiconductor material, Silicon, poly-Silicon, lightly doped poly-Silicon, doped poly-Silicon, highly-doped poly-Silicon, or any combination thereof. DTI may be used to form the isolation trenches 58 in the epitaxial layer 64 down to the insulator layer 62 to laterally isolate the LHV-SCR 80 from other devices that may be formed using the epitaxial layer 64. The combination of the isolation trenches 58 and the insulator layer 62 may provide complete isolation of the LHV-SCR 80 from other devices.

Figure 17:
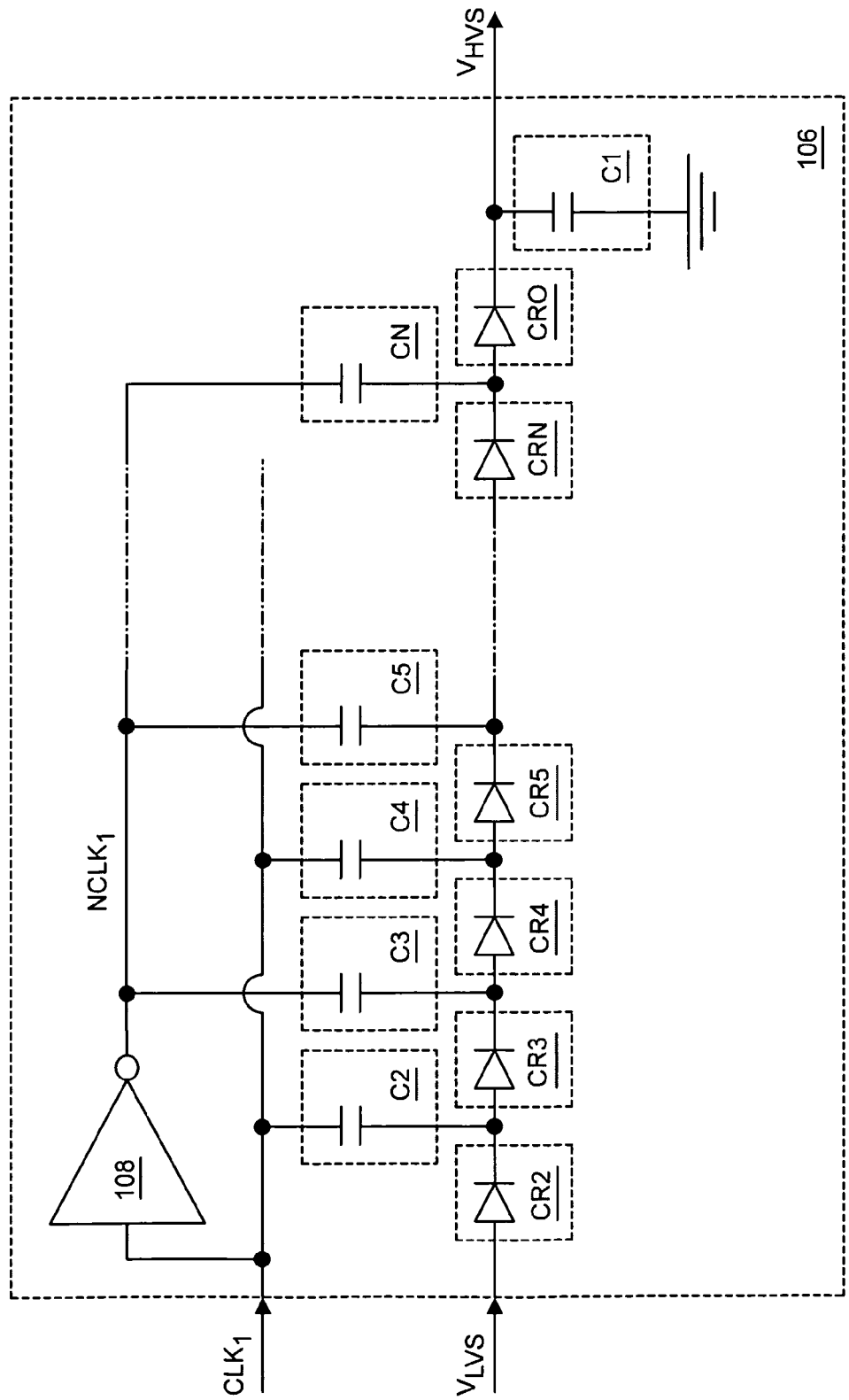
FIG. 17 shows a charge pump circuit according to one embodiment of the present invention.

FIG. 17 shows a charge pump circuit 106 according to one embodiment of the present invention. The charge pump circuit 106, which is a Dickson charge pump, uses a combination of diode and capacitive elements that are switched with a first switching clock $CLK_1$ to pump charge from capacitive elements to following capacitive elements to generate a large voltage. The charge pump circuit 106 receives the first switching clock $CLK_1$ and a direct current (DC) low-voltage supply signal $V_{LVS}$, and generates a DC high-voltage supply signal $V_{HVS}$. The first switching clock $CLK_1$ feeds an inverter 108, which generates an inverted first switching clock $NCLK_1$ that is phase-shifted 180 degrees from the first switching clock $CLK_1$. A chain of series-coupled diode elements is coupled, anode to cathode, between the DC low-voltage supply signal $V_{LVS}$ and the DC high-voltage supply signal $V_{HVS}$. A capacitive element is coupled between each anode to cathode connection in the chain and either the first switching clock $CLK_1$ or the inverted first switching clock $NCLK_1$.

Specifically, a first capacitive element C1 is coupled between the cathode of an output diode element CRO and ground to provide the DC high-voltage supply signal $V_{HVS}$. The anode of a second diode element CR2 receives the DC low-voltage supply signal $V_{LVS}$. The cathode of the second diode element CR2 is coupled to the anode of a third diode element CR3 and a second capacitive element C2. The cathode of the third diode element CR3 is coupled to the anode of a fourth diode element CR4 and a third capacitive element C3. The cathode of the fourth diode element CR4 is coupled to the anode of a fifth diode element CR5 and a fourth capacitive element C4. The cathode of the fifth diode element CR5 is coupled to the anode of a subsequent diode element (not shown) and a fifth capacitive element C5. The rest of the diode chain is similarly constructed until the cathode of an Nth diode element CRN is coupled to the anode of the output diode element CR0 and an Nth capacitive element CN. All even capacitive elements capacitive C2, C4 are coupled to the first switching clock $CLK_1$. All odd capacitive elements capacitive C3, C5, CN are coupled to the inverted first switching clock $NCLK_1$.

When the first switching clock $CLK_1$ is "LOW," the inverted first switching clock $NCLK_1$ is "HIGH," the second capacitive element C2 is charged up through the second diode element CR2 by the DC low-voltage supply signal $V_{LVS}$, the fourth capacitive element C4 is charged up through the fourth diode element CR4 by the third capacitive element C3, all subsequent even capacitive elements are charged up through their respective even diode elements by their respective preceding odd capacitive elements, and all odd diode elements CR3, CR5, CRN are reverse biased. When the first switching clock $CLK_1$ is "HIGH", the inverted first switching clock $NCLK_1$ is "LOW", the third capacitive element C3 is charged up through the third diode element CR3 by the second capacitive element C2, the fifth capacitive element C5 is charged up through the fifth diode element CR5 by the fourth capacitive element C4, all subsequent odd capacitive elements are charged up through their respective odd diode elements by their respective preceding even capacitive elements, and all even diode elements CR2, CR4 are reverse biased. If the charge pump circuit 106 does not have a load, and ignoring diode drops and losses, each capacitive element down the chain will have a total voltage that is higher than its predecessor in the chain by about the amplitude of the first switching clock $CLK_1$. Therefore, the voltage of the DC high-voltage supply signal $V_{HVS}$ may be increased by adding more links to the chain. As the voltage down the chain increases, isolation of one or more of the elements of the chain C2, C3, C4, C5, CN, CR2, CR3, CR4, CR5, CRN, CR0 from other circuit elements may be necessary.

Alternate embodiments of the charge pump circuit 106 may use configurations other than a Dickson charge pump with any number of diode elements and capacitive elements. Any embodiments of the charge pump circuit 106 may use one or more LHVD 66. In one embodiment of the present invention, the voltage of the DC low-voltage supply signal $V_{LVS}$ may be less than about ten volts, and the voltage of the DC high-voltage supply signal $V_{HVS}$ may be greater than about ten volts. In an exemplary embodiment of the present invention, the voltage of the DC low-voltage supply signal $V_{LVS}$ may be between about 1.5 volts and about five volts, and the voltage of the DC high-voltage supply signal $V_{HVS}$ may be between about 40 volts and about 100 volts.

Figure 18B:
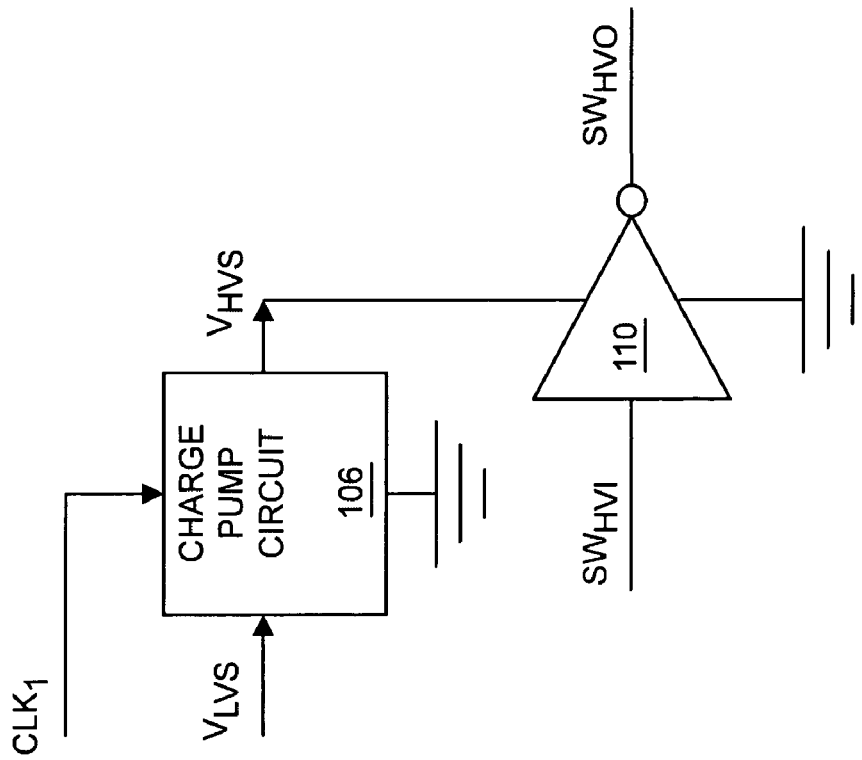
FIG. 18B shows the charge pump circuit illustrated in FIG. 17 combined with the high-voltage switch illustrated in FIG. 18A.
Figure 18A:
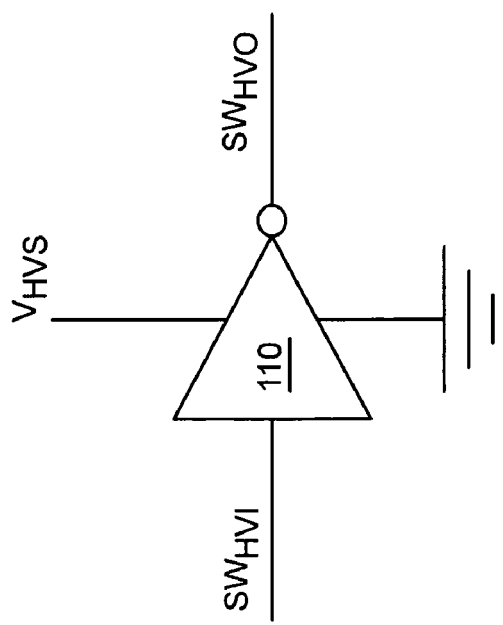
FIG. 18A shows a high-voltage switch according to one embodiment of the present invention.

FIG. 18A shows a high-voltage switch 110 according to one embodiment of the present invention. A high-voltage switching input signal $SW_{HVI}$ feeds the high-voltage switch 110, which provides a high-voltage switching output signal $SW_{HVO}$ based on the high-voltage switching input signal $SW_{HVI}$. The high-voltage switch 110 may be powered from the DC high-voltage supply signal $V_{HVS}$. In one embodiment of the present invention, the high-voltage switch 110 is inverting. In an alternate embodiment of the present invention, the high-voltage switch 110 is non-inverting. An input switching threshold of the high-voltage switch 110 may be about 50% of the magnitude of the DC high-voltage supply signal $V_{HVS}$, which may be greater than about ten volts and, in an exemplary embodiment of the present invention, may be between about 40 volts and about 100 volts. The output voltage swing of the high-voltage switching output signal $SW_{HVO}$ may be between about ground and the magnitude of the DC high-voltage supply signal $V_{HVS}$. FIG. 18B shows the charge pump circuit 106 illustrated in FIG. 17 combined with the high-voltage switch 110 illustrated in FIG. 18A. The charge pump circuit 106 provides the DC high-voltage supply signal $V_{HVS}$, which powers the high-voltage switch 110.

Figure 19B:
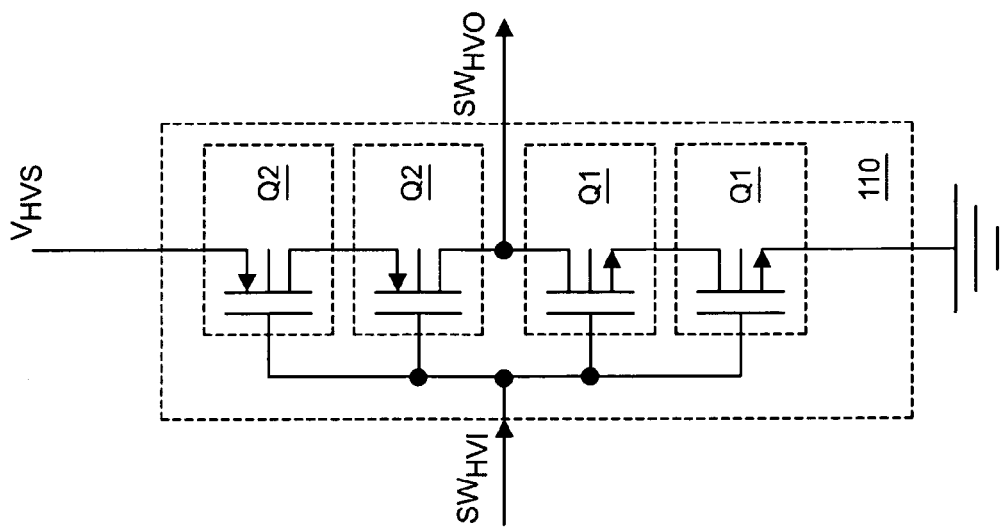
FIGS. 19A and 19B show details of the high-voltage switch using different combinations of complementary MOSFETs.
Figure 19A:
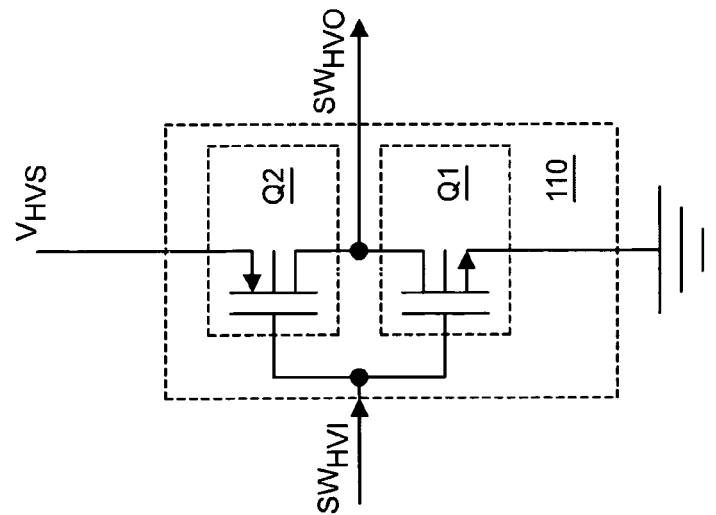

FIGS. 19A and 19B show details of the high-voltage switch 110 using different combinations of complementary MOSFETs. FIG. 19A shows the isolated N-type MOSFET Q1 coupled in series with the isolated P-type MOSFET Q2 to form an inverting high-voltage switch 110. The gates of the isolated MOSFETs Q1, Q2 are coupled together and receive the high-voltage switching input signal $SW_{HVI}$. The drains of the isolated MOSFETs Q1, Q2 are coupled together and provide the high-voltage switching output signal $SW_{HVO}$. The source of the isolated N-type MOSFET Q1 is coupled to ground and the source of the isolated P-type MOSFET Q2 receives the DC high-voltage supply signal $V_{HVS}$. The isolated N-type MOSFET Q1, the isolated P-type MOSFET Q2, or both, may include one or more LHV-MOSFET 34.

FIG. 19B shows a stacked configuration of MOSFETs. To further increase the voltage handling capability of the high-voltage switch 110, two isolated N-type MOSFETs Q1 are coupled in series to replace the single isolated N-type MOSFET Q1, and two isolated P-type MOSFETs Q2 are coupled in series to replace the single isolated P-type MOSFET Q2. The drain of one of the series-coupled isolated N-type MOSFETs Q1 is coupled to the source of the other series-coupled isolated N-type MOSFETs Q1, and the drain of one of the series-coupled isolated P-type MOSFETs Q2 is coupled to the source of the other series-coupled isolated P-type MOSFETs Q2. The gates of both of the isolated N-type MOSFETs Q1 are coupled together, and the gates of both of the isolated P-type MOSFETs Q2 are coupled together. Alternate embodiments of the present invention may use any number of series-coupled isolated N-type MOSFETs Q1 and any number of series-coupled isolated P-type MOSFETs Q2. The voltage between the high-voltage switching output signal $SW_{HVO}$ and ground is divided between each of the series-coupled isolated N-type MOSFETs Q1. The voltage between the DC high-voltage supply signal $V_{HVS}$ and the high-voltage switching output signal $SW_{HVO}$ is divided between each of the series-coupled isolated P-type MOSFETs Q2. Since the drain-to-source voltage capability of a MOSFET is determined by the reverse breakdown voltage of a P-N junction, and a maximum gate voltage may be determined by a gate-to-channel breakdown voltage across an oxide layer, it may be straightforward to construct a MOSFET having a higher gate-to-source voltage capability than the drain-to-source voltage capability.

FIGS. 20A and 20B show details of the high-voltage switch 110 using different single-ended configurations of MOSFETs. In FIG. 20A, the isolated P-type MOSFET Q2 is replaced with a third resistive element R3, the first end of which is coupled to the drain of the isolated N-type MOSFETs Q1, and the second end of which receives the DC high-voltage supply signal $V_{HVS}$. In FIG. 20B, the isolated N-type MOSFET Q1 is replaced with a fourth resistive element R4, the first end of which is coupled to the drain of the isolated P-type MOSFET Q2, and the second end of which is coupled to ground. Since the third, fourth, or both, resistive elements R3, R4 may consume power when the N-type, P-type, or both isolated MOSFETs Q1, Q2 are "ON," the single-ended configurations shown in FIGS. 20A and 20B may be less efficient than complementary configurations shown in FIGS. 19A and 19B.

Figure 21:
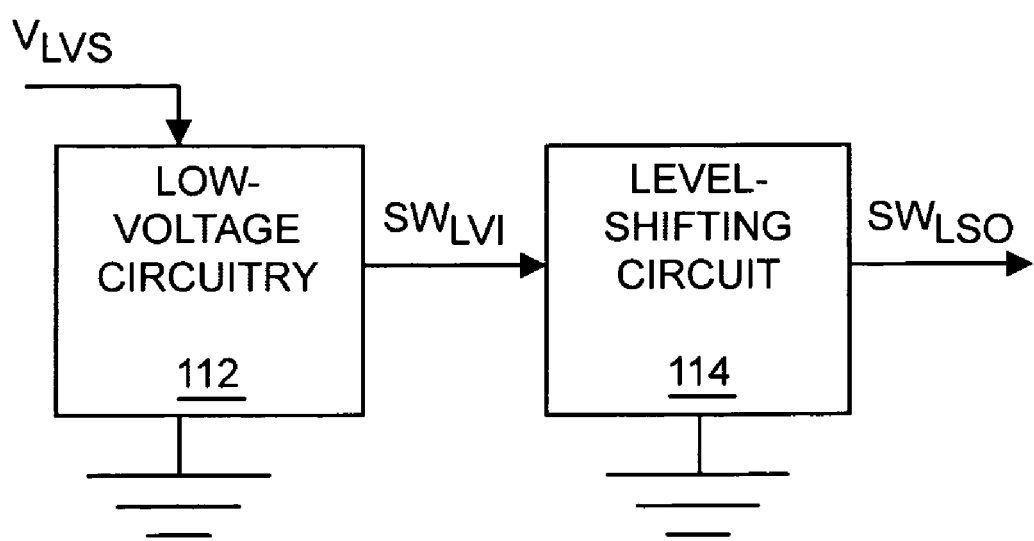
FIG. 21 shows low-voltage circuitry driving a level-shifting circuit, according to one embodiment of the present invention.

FIG. 21 shows low-voltage circuitry 112 driving a level-shifting circuit 114, according to one embodiment of the present invention. The low-voltage circuitry 112 may include computing circuitry, clocks, dividers, memory, decoders, logic, and any other digital circuitry that may be provided from a wafer that is fabricated using low-voltage foundry technology. The low-voltage circuitry 112 may provide a low-voltage switching input signal $SW_{LVI}$ to the level-shifting circuit 114, which level-shifts the low-voltage switching input signal $SW_{LVI}$ to provide a level-shifted switching output signal $SW_{LSO}$. In one embodiment of the present invention, the level-shifting circuit 114 is inverting. In an alternate embodiment of the present invention, the level-shifting circuit 114 is non-inverting. The DC low-voltage supply signal $V_{LVS}$ may provide power to the low-voltage circuitry 112, the level-shifting circuit 114, or both. In one embodiment of the present invention, the voltage of the DC low-voltage supply signal $V_{LVS}$ may be less than about ten volts, and in an exemplary embodiment of the present invention, the voltage of the DC low-voltage supply signal $V_{LVS}$ may be between about 1.5 volts and about five volts.

Figure 22:
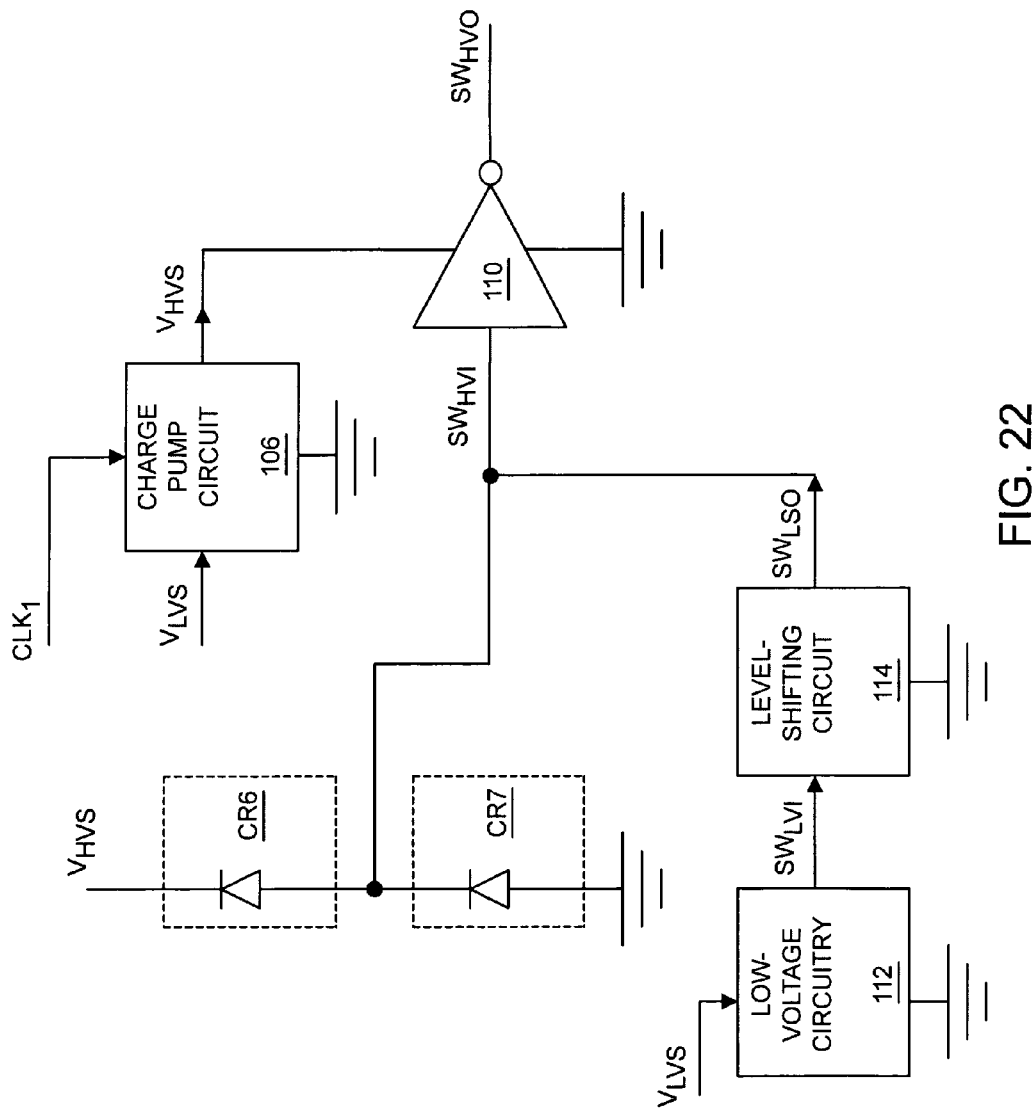
FIG. 22 shows the low-voltage circuitry and the level-shifting circuit illustrated in FIG. 21 combined with the charge pump circuit and high-voltage switch illustrated in FIG. 18B.

FIG. 22 shows the low-voltage circuitry 112 and the level-shifting circuit 114 illustrated in FIG. 21 combined with the charge pump circuit 106 and high-voltage switch 110 illustrated in FIG. 18B. The level-shifted switching output signal $SW_{LSO}$ provides the high-voltage switching input signal $SW_{HVI}$. Therefore, the low-voltage circuitry 112 controls the high-voltage switching output signal $SW_{HVO}$ with the low-voltage switching input signal $SW_{LVI}$. In one embodiment of the present invention, a sixth diode element CR6 and a seventh diode element CR7 may be added to protect a switching input to the high-voltage switch 110. The cathode of the sixth diode element CR6 receives the DC high-voltage supply signal $V_{HVS}$. The anode of the sixth diode element CR6 is coupled to the cathode of the seventh diode element CR7 and the switching input to the high-voltage switch 110. The anode of the seventh diode element CR7 is coupled to ground. The sixth, seventh, or both, diode element CR6, CR7 may include one or more LHVD 66. The sixth and seventh diode elements CR6, CR7 prevent the switching input to the high-voltage switch 110 from swinging much above the DC high-voltage supply signal $V_{HVS}$ or much below ground.

Figure 23:
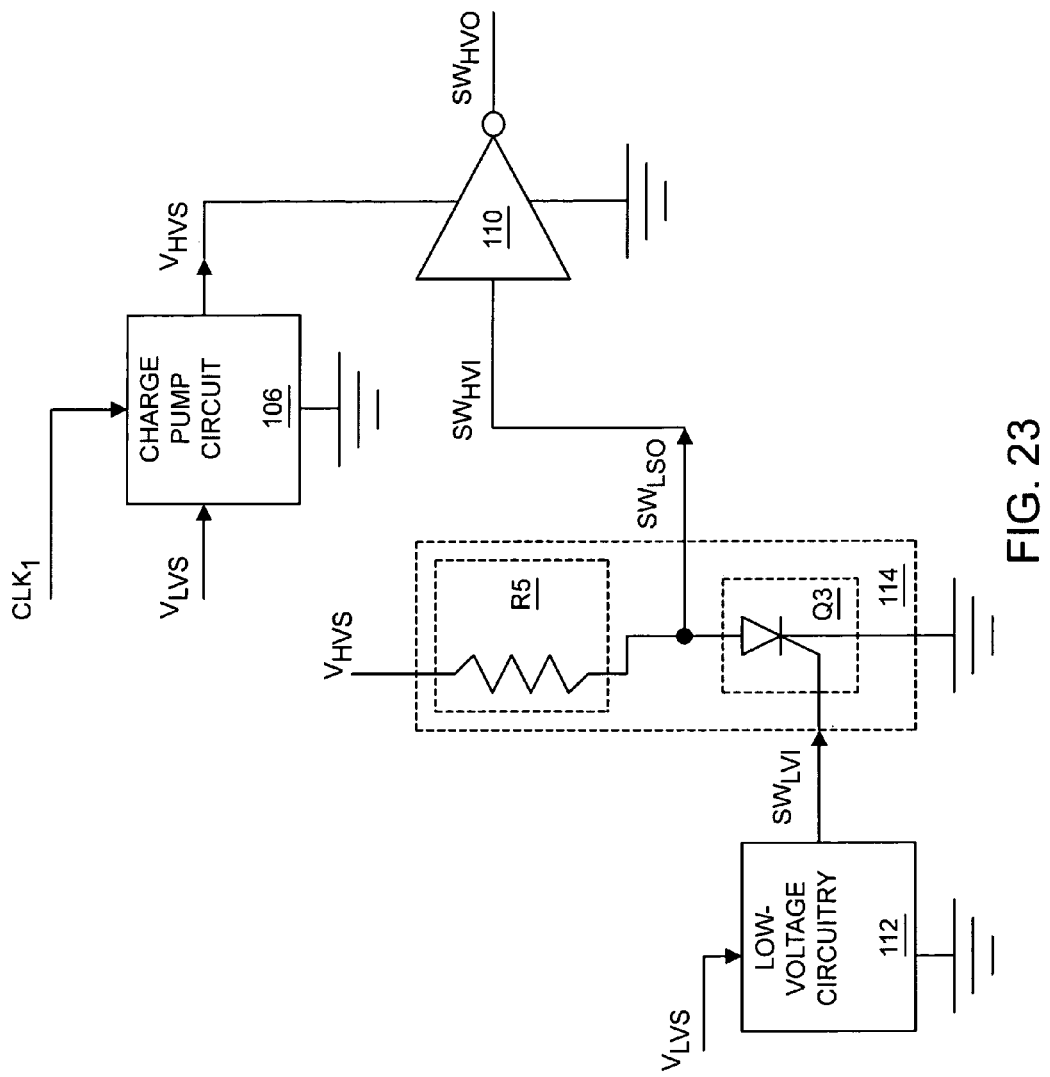
FIG. 23 shows details of the level-shifting circuit illustrated in FIG. 22.

FIG. 23 shows details of the level-shifting circuit 114 illustrated in FIG. 22. The level-shifting circuit 114 includes a cathode-referenced SCR Q3, which may be non-latching, and a fifth resistive element R5, one end of which is coupled to the cathode of the cathode-referenced SCR Q3 to provide the level-shifted switching output signal $SW_{LSO}$. The other end of the fifth resistive element R5 receives the DC high-voltage supply signal $V_{HVS}$. The cathode of the cathode-referenced SCR Q3 is coupled to ground and the cathode-referenced control input of the cathode-referenced SCR Q3 receives the low-voltage switching input signal $SW_{LVI}$. When the low-voltage switching input signal $SW_{LVI}$ is above an SCR trigger threshold, the cathode-referenced SCR Q3 triggers "ON," which pulls the level-shifted switching output signal $SW_{LSO}$ down toward ground. Since the cathode-referenced SCR Q3 is non-latching, when the low-voltage switching input signal $SW_{LVI}$ is below the SCR trigger threshold, the cathode-referenced SCR Q3 is "OFF," which allows the fifth resistive element R5 to pull the level-shifted switching output signal $SW_{LSO}$ up toward the DC high-voltage supply signal $V_{HVS}$.

In one embodiment of the present invention, the SCR trigger threshold is between about 0.5 volts and about two volts, and in an exemplary embodiment of the present invention, the SCR trigger threshold is between about one volt and about 1.5 volts. In one embodiment of the present invention, the level-shifted switching output signal $SW_{LSO}$ may swing from about ground to greater than about ten volts, and in an exemplary embodiment of the present invention, the level-shifted switching output signal $SW_{LSO}$ may swing from about ground to between about 40 volts and about 100 volts. In one embodiment of the present invention, the high-voltage switching output signal $SW_{HVO}$ may swing from about ground to greater than about ten volts, and in an exemplary embodiment of the present invention, the high-voltage switching output signal $SW_{HVO}$ may swing from about ground to between about 40 volts and about 100 volts. Since both the cathode-referenced SCR Q3 and the high-voltage switch 110 are inverting, when the low-voltage switching input signal $SW_{LVI}$ is "LOW," the high-voltage switching output signal $SW_{HVO}$ is driven "LOW," and when the low-voltage switching input signal $SW_{LVI}$ is "HIGH," the high-voltage switching output signal $SW_{HVO}$ is driven "HIGH." Alternate embodiments of the level-shifting circuit 114 may include an anode-referenced SCR Q4, a Triac Q5, another thyristor, or the like.

Figure 24:
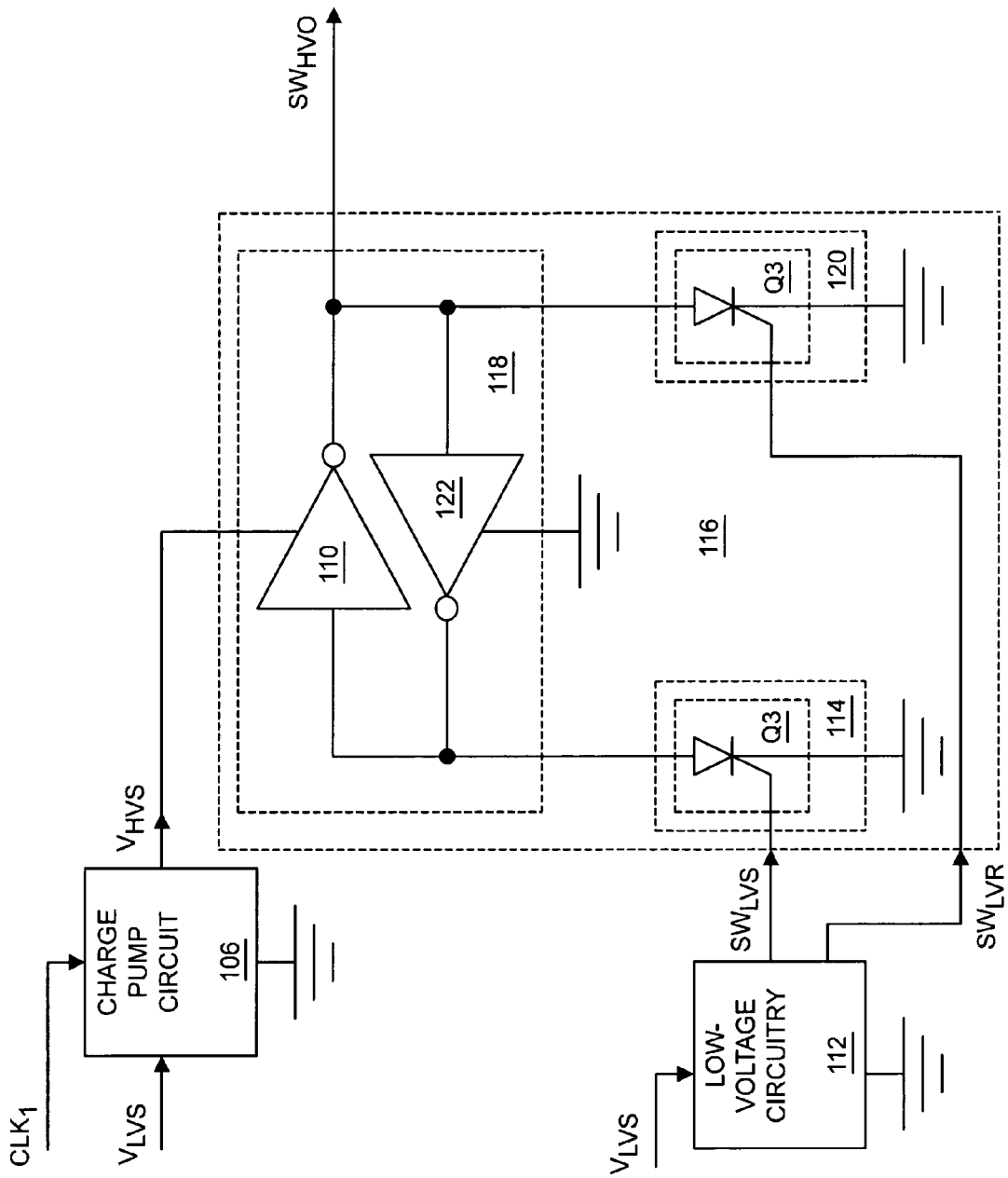
FIG. 24 shows the low-voltage circuitry driving a low-voltage to high-voltage latching switch, according to one embodiment of the present invention.

FIG. 24 shows the low-voltage circuitry 112 driving a low-voltage to high-voltage latching switch 116, according to one embodiment of the present invention. The latching switch 116 includes a latch 118, the level-shifting circuit 114, and a complementary level-shifting circuit 120. The latch 118 includes an inverting high-voltage switch 110 and a complementary inverting high-voltage switch 122 configured as a memory cell with the output of the inverting high-voltage switch 110 driving the switching input to the complementary inverting high-voltage switch 122, and the output of the complementary inverting high-voltage switch 122 driving the switching input to the inverting high-voltage switch 110. When the switching input to the inverting high-voltage switch 110 is "LOW," its output is driven "HIGH," which is provided to the switching input to the complementary inverting high-voltage switch 122, which causes its output to be driven "LOW," which is provided to the switching input to the inverting high-voltage switch 110, thereby providing a stable condition. Likewise, when the switching input to the inverting high-voltage switch 110 is "HIGH," its output is driven "LOW," which is provided to the switching input to the complementary inverting high-voltage switch 122, which causes its output to be driven "HIGH," which is provided to the switching input to the inverting high-voltage switch 110, thereby providing a stable condition. Therefore, both states of the latch 118 are stable. For the latch 118 to change state, one of the outputs must be over-driven to an opposite state.

The level-shifting circuit 114 and the complementary level-shifting circuit 120 each include a cathode-referenced SCR Q3. The anode of one of the SCRs Q3 is coupled to the output of the inverting high-voltage switch 110 and the anode of the other cathode-referenced SCR Q3 is coupled to the output of the complementary inverting high-voltage switch 122. The cathodes of both SCRs Q3 are coupled to ground and the DC high-voltage supply signal $V_{HVS}$ provides power for both high-voltage switches 110, 122. The low-voltage circuitry 112 provides a low-voltage switch set signal $SW_{LVS}$ to the cathode-referenced control input of the cathode-referenced SCR Q3 of the level-shifting circuit 114 and a low-voltage switch reset signal $SW_{LVR}$ to the cathode-referenced control input of the cathode-referenced SCR Q3 of the complementary level-shifting circuit 120.

Normally both of the low-voltage switch signals $SW_{LVS}$, $SW_{LVR}$ are below their respective SCR trigger thresholds, which cause both SCRs Q3 to be "OFF." When the low-voltage switch set signal $SW_{LVS}$ pulses above and then below the SCR trigger threshold, the cathode-referenced SCR Q3 of the level-shifting circuit 114 triggers "ON," thereby pulling the output of the complementary inverting high-voltage switch 122 toward ground, which causes the output of the inverting high-voltage switch 110 to go "HIGH," such that the high-voltage switching output signal $SW_{HVO}$ goes "HIGH," and the output of the complementary inverting high-voltage switch 122 to go "LOW." Once the output of the complementary inverting high-voltage switch 122 goes "LOW," the cathode-referenced SCR Q3 of the level-shifting circuit 114 stops conducting current through its anode. When the low-voltage switch reset signal $SW_{LVR}$ pulses above and then below the SCR trigger threshold, the cathode-referenced SCR Q3 of the complementary level-shifting circuit 120 triggers "ON," thereby pulling the output of the inverting high-voltage switch 110 toward ground, which causes the output of the complementary inverting high-voltage switch 122 to go "HIGH," and the output of the inverting high-voltage switch 110 to go "LOW" along with the high-voltage switching output signal $SW_{HVO}$. Once the output of the inverting high-voltage switch 110 goes "LOW," the cathode-referenced SCR Q3 of the complementary level-shifting circuit 120 stops conducting current through its anode.

If the cathode-referenced SCR Q3 is non-latching, then it is "OFF" when the low-voltage switch set signal $SW_{LVS}$ is below the SCR trigger threshold. If the cathode-referenced SCR Q3 is latching, then once it is "ON," it only goes "OFF" when both the low-voltage switch set signal $SW_{LVS}$ is below the SCR trigger threshold and current through its anode is below an anode-current threshold. In an exemplary embodiment of the present invention, both cathode-referenced SCRs Q3 are latching. In an alternate embodiment of the present invention, either or both SCRs Q3 are non-latching.

In one embodiment of the present invention, the SCR trigger threshold is between about 0.5 volts and about two volts, and in an exemplary embodiment of the present invention, the SCR trigger threshold is between about one volt and about 1.5 volts. In one embodiment of the present invention, the high-voltage switching output signal $SW_{HVO}$ may swing from about ground to greater than about ten volts, and in an exemplary embodiment of the present invention, the high-voltage switching output signal $SW_{HVO}$ may swing from about ground to between about 40 volts and about 100 volts. Alternate embodiments of each of the level-shifting circuits 114, 120 may include an anode-referenced SCR Q4, a Triac Q5, another thyristor, any combination thereof, or the like.

Figure 25:
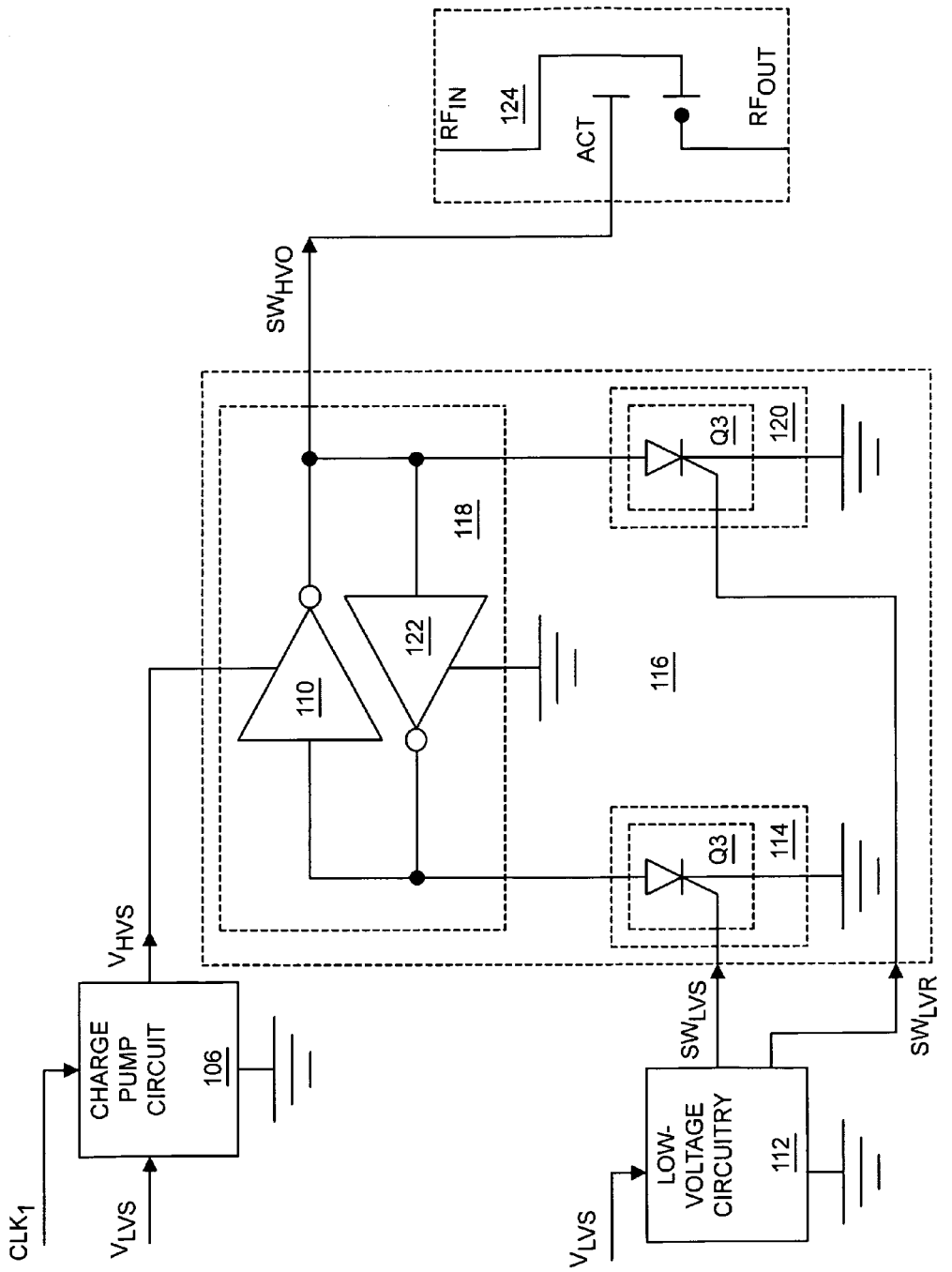
FIG. 25 shows the low-voltage to high-voltage latching switch driving a microelectromechanical system (MEMS) switch, according to one embodiment of the present invention.

FIG. 25 shows the low-voltage to high-voltage latching switch 116 driving a MEMS switch 124, according to one embodiment of the present invention. The MEMS switch 124 may include an RF input $RF_{IN}$ and an RF output $RF_{OUT}$ for connecting to RF circuits, such as antennas, RF receivers, and RF transmitters. When the MEMS switch 124 is OPEN, since there is physical isolation, the open impedance may be very stable with respect to frequency. Additionally, when the MEMS switch 124 is CLOSED, since there is a physical contact, the closed impedance may be very stable with respect to frequency. The MEMS switch 124 may include an actuator input ACT, which is fed from the high-voltage switching output signal $SW_{HVO}$ to either open or close the MEMS switch 124.

Figure 26:
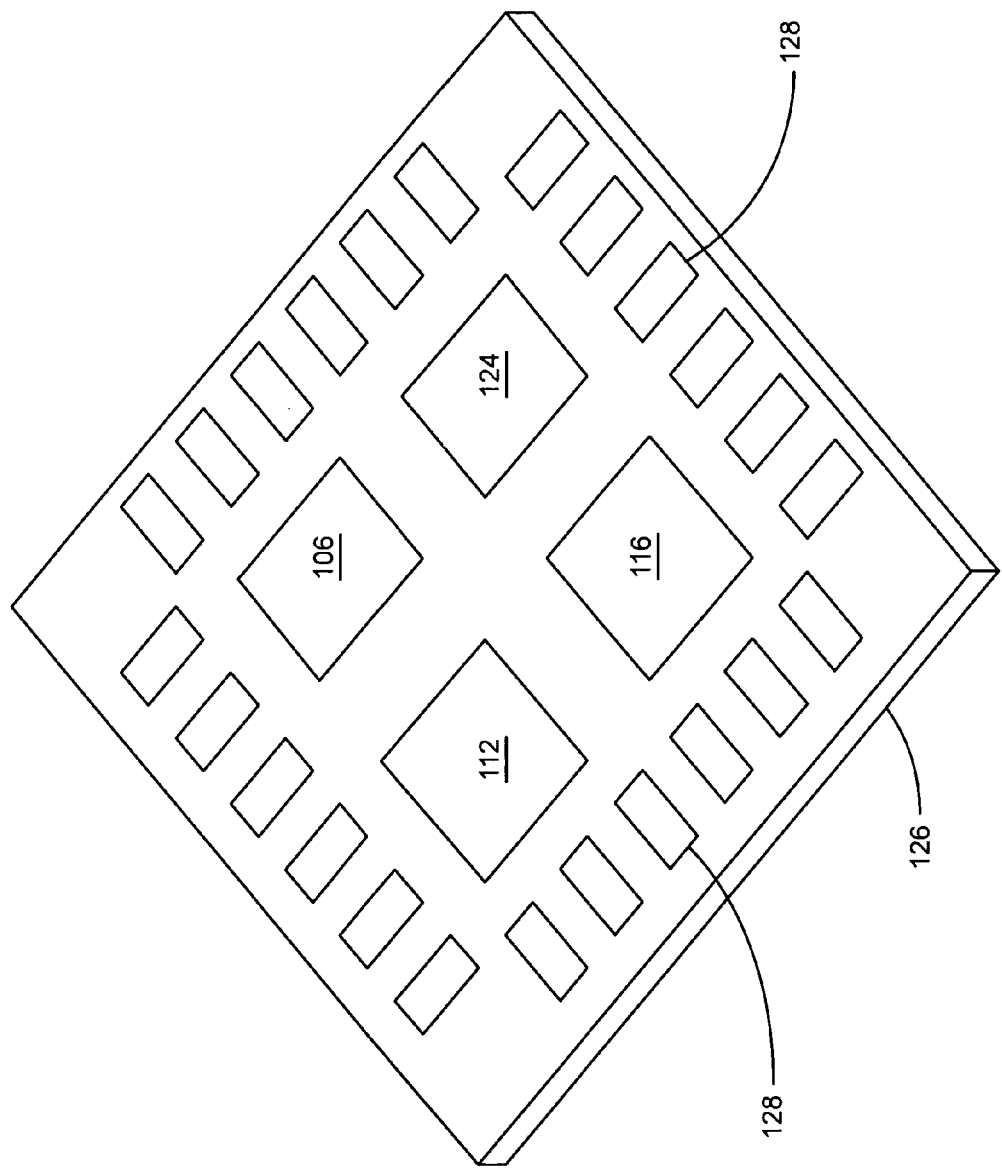
FIG. 26 shows the low-voltage circuitry, the charge pump circuit, the low-voltage to high-voltage latching switch, and the MEMS switch integrated onto a single semiconductor die, according to one embodiment of the present invention.

FIG. 26 shows the low-voltage circuitry 112, the charge pump circuit 106, the low-voltage to high-voltage latching switch 116, and the MEMS switch 124 integrated onto a single semiconductor die 126 with inter-connection pads 128, according to one embodiment of the present invention. The single semiconductor die 126 may be provided by a semiconductor wafer (not shown), such as an SOI wafer, which may be fabricated using low-voltage foundry technology, such as LV-CMOS, LDMOS, or the like. Process steps that are compatible with low-voltage foundry technology may be used to fabricate high-voltage devices. Such process steps may include field implanting, VTN adjustments, VTP adjustments, HVPwell fabrication, HVNwell fabrication, any combination thereof, or the like. Alternate embodiments of the present invention may integrate the low-voltage circuitry 112, the charge pump circuit 106, the low-voltage to high-voltage latching switch 116, the MEMS switch 124, the high-voltage switch 110, the level-shifting circuit 114, the LHV-MOSFET 34, series-coupled LHV-MOSFETs 34, the LHVD 66, the LHV-SCR 80, a lateral high-voltage thyristor, or any combination thereof, onto the single semiconductor die 126. All or part of the low-voltage circuitry 112, the charge pump circuit 106, the low-voltage to high-voltage latching switch 116, the MEMS switch 124, the high-voltage switch 110, the level-shifting circuit 114, the LHV-MOSFET 34, series-coupled LHV-MOSFETs 34, the LHVD 66, the LHV-SCR 80, a lateral high-voltage thyristor, or any combination thereof, may be provided by the SOI device layer 32, the epitaxial layer 64, the epitaxial layer 64 formed over the SOI device layer 32, the epitaxial layer 64 formed over the traditional semiconductor wafer 10, or any combination thereof.

Figure 27:
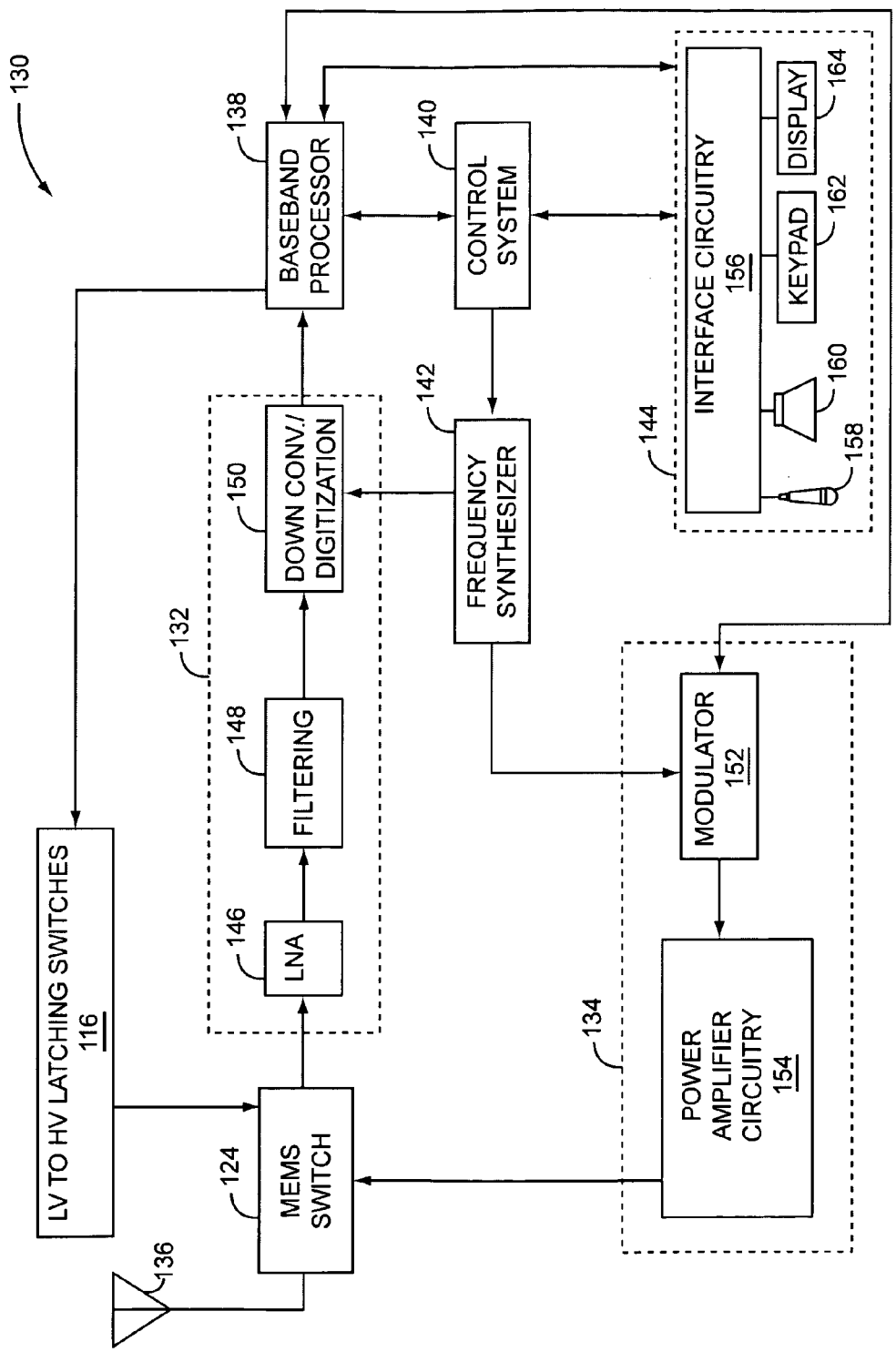
FIG. 27 shows an application example of the present invention used in a mobile terminal.

An application example of low-voltage to high-voltage latching switches 116 driving MEMS switches 124 is in a mobile terminal 130, the basic architecture of which is represented in FIG. 27. The mobile terminal 130 may include a receiver front end 132, a radio frequency transmitter section 134, an antenna 136, the MEMS switches 124, a baseband processor 138, a control system 140, a frequency synthesizer 142, and an interface 144. The low-voltage to high-voltage latching switches 116 configure the MEMS switches 124 for receiving, such that the receiver front end 132 receives information bearing radio frequency signals from one or more remote transmitters provided by a base station (not shown). A low noise amplifier (LNA) 146 amplifies the signal. A filter circuit 148 minimizes broadband interference in the received signal, while down conversion and digitization circuitry 150 down converts the filtered, received signal to an intermediate or baseband frequency signal, which is then digitized into one or more digital streams. The receiver front end 132 typically uses one or more mixing frequencies generated by the frequency synthesizer 142. The baseband processor 138 processes the digitized received signal to extract the information or data bits conveyed in the received signal. This processing typically comprises demodulation, decoding, and error correction operations. As such, the baseband processor 138 is generally implemented in one or more digital signal processors (DSPs).

On the transmit side, the baseband processor 138 receives digitized data, which may represent voice, data, or control information, from the control system 140, which it encodes for transmission. The low-voltage to high-voltage latching switches 116 configure the MEMS switches 124 for transmitting. The encoded data is output to the transmitter 134, where it is used by a modulator 152 to modulate a carrier signal that is at a desired transmit frequency. Power amplifier circuitry 154 amplifies the modulated carrier signal to a level appropriate for transmission, and delivers the amplified and modulated carrier signal to the antenna 136 through the MEMS switches 124.

A user may interact with the mobile terminal 130 via the interface 144, which may include interface circuitry 156 associated with a microphone 158, a speaker 160, a keypad 162, and a display 164. The interface circuitry 156 typically includes analog-to-digital converters, digital-to-analog converters, amplifiers, and the like. Additionally, it may include a voice encoder/decoder, in which case it may communicate directly with the baseband processor 138. The microphone 158 will typically convert audio input, such as the user's voice, into an electrical signal, which is then digitized and passed directly or indirectly to the baseband processor 138. Audio information encoded in the received signal is recovered by the baseband processor 138, and converted by the interface circuitry 156 into an analog signal suitable for driving the speaker 160. The keypad 162 and display 164 enable the user to interact with the mobile terminal 130, input numbers to be dialed, address book information, or the like, as well as monitor call progress information.

Those skilled in the art will recognize improvements and modifications to the preferred embodiments of the present invention. All such improvements and modifications are considered within the scope of the concepts disclosed herein and the claims that follow.

What is claimed is:

1. A semiconductor wafer comprising:
    a first insulator layer;
    a first semiconductor device layer formed over the first insulator layer and comprising;
        a source, and a source extension adjacent to the source;
        a channel formed between the source and the drain;
        a drain, and a drain extension adjacent to the drain; and
        first intrinsic material between the source and the drain, such that the first intrinsic material has a resistivity greater than about one ohm·centimeter and the source, the drain, and the first intrinsic material form a lateral high-voltage metal oxide semiconductor field effect transistor (LHV-MOSFET); and
    a second insulator layer formed over the first semiconductor device layer; and wherein:
        the source comprises highly-doped semiconductor material having a carrier concentration greater than about $10^{18}$ cm$^{-3}$;
        the drain comprises highly-doped semiconductor material having a carrier concentration greater than about $10^{18}$ cm$^{-3}$;
        the channel comprises doped semiconductor material having a carrier concentration less than about $10^{18}$ cm$^{-3}$;
        the source extension comprises doped semiconductor material having a carrier concentration less than about $10^{18}$ cm$^{-3}$; and
        the drain extension comprises doped semiconductor material having a carrier concentration less than about $10^{18}$ cm$^{-3}$.

2. The semiconductor wafer of claim 1 wherein a breakdown voltage between the drain and the source is greater than about 20 volts.

3. The semiconductor wafer of claim 1 wherein a breakdown voltage between the drain and the source is greater than about 50 volts.

4. The semiconductor wafer of claim 1 wherein a reverse breakdown voltage of at least one of a first diode junction formed from highly-doped N-type semiconductor material adjacent to doped P-type semiconductor material and a second diode junction formed from highly-doped P-type semiconductor material adjacent to doped N-type semiconductor material is less than about 20 volts.

5. The semiconductor wafer of claim 1 further comprising a Silicon-on-Insulator (SOI) wafer having a substrate.

6. The semiconductor wafer of claim 5 wherein an SOI insulator layer is formed over the substrate, an SOI device layer is formed over the SOI insulator layer, the SOI insulator layer provides the first insulator layer, and the SOI device layer provides the first semiconductor device layer.

7. The semiconductor wafer of claim 5 wherein an SOI insulator layer is formed over the substrate, an SOI device layer is formed over the SOI insulator layer, an epitaxial layer is formed over the SOI device layer, and the epitaxial layer provides the first semiconductor device layer.

8. The semiconductor wafer of claim 1 wherein the LHV-MOSFET further comprises a gate formed over the second insulator layer.

9. The semiconductor wafer of claim 8 wherein the gate comprises poly-Silicon.

10. The semiconductor wafer of claim 8 wherein the second insulator layer is a local oxidation of Silicon (LOCOS) layer.

11. The semiconductor wafer of claim 8 wherein a breakdown voltage between the gate and the channel is greater than about 20 volts.

12. The semiconductor wafer of claim 8 wherein a breakdown voltage between the gate and the channel is greater than about 50 volts.

13. The semiconductor wafer of claim 8 further comprising second intrinsic material between the source and the channel, wherein the first intrinsic material is between the drain and the channel.

14. The semiconductor wafer of claim 8 wherein the channel comprises doped semiconductor material.

15. The semiconductor wafer of claim 1 wherein:
    the source comprises highly-doped N-type semiconductor material;
    the drain comprises highly-doped N-type semiconductor material;
    the channel comprises doped P-type semiconductor material;
    the source extension comprises doped N-type semiconductor material; and
    the drain extension comprises doped N-type semiconductor material.

16. The semiconductor wafer of claim 1 wherein:
    the source comprises highly-doped P-type semiconductor material;
    the drain comprises highly-doped P-type semiconductor material;
    the channel comprises doped N-type semiconductor material;
    the source extension comprises doped P-type semiconductor material; and
    the drain extension comprises doped P-type semiconductor material.

17. The semiconductor wafer of claim 1 wherein the LHV-MOSFET is laterally isolated from at least one other device in the first semiconductor device layer using deep trench isolation.

18. The semiconductor wafer of claim 1 further comprising a microelectromechanical system (MEMS) switch.

19. The semiconductor wafer of claim 18 wherein the LHV-MOSFET is adapted to provide an actuation signal to an actuator of the MEMS switch.

* * * * *